United States Patent
Ito et al.

(10) Patent No.: US 8,216,684 B2
(45) Date of Patent: Jul. 10, 2012

(54) METHOD FOR BONDING MEMBERS, COMPOSITE FILM AND USE THEREOF

(75) Inventors: Yuichi Ito, Ichihara (JP); Yugo Yamamoto, Chiba (JP); Kimihiko Saito, Chiba (JP)

(73) Assignee: Mitsu Chemicals, Inc., Minato-Ku, Tokyo (JP)

( * ) Notice: Subject to any disclaimer, the term of this patent is extended or adjusted under 35 U.S.C. 154(b) by 1147 days.

(21) Appl. No.: 11/883,525

(22) PCT Filed: Jan. 30, 2006

(86) PCT No.: PCT/JP2006/301495
§ 371 (c)(1),
(2), (4) Date: Aug. 1, 2007

(87) PCT Pub. No.: WO2006/082794
PCT Pub. Date: Aug. 10, 2006

(65) Prior Publication Data
US 2008/0160339 A1    Jul. 3, 2008

(30) Foreign Application Priority Data

Feb. 1, 2005  (JP) ................................ 2005-025690
Feb. 1, 2005  (JP) ................................ 2005-025737
Apr. 4, 2005  (JP) ................................ 2005-108091

(51) Int. Cl.
*B32B 27/00* (2006.01)
*C09J 163/00* (2006.01)
(52) U.S. Cl. ...................... 428/451; 156/330; 156/331.4; 156/331.7; 156/332; 428/413; 428/425.5
(58) Field of Classification Search .................. 156/330, 156/331.4, 331.7, 332; 428/413, 425.5, 451
See application file for complete search history.

(56) References Cited

U.S. PATENT DOCUMENTS 4,760,005 A    7/1988  Pai
(Continued)

FOREIGN PATENT DOCUMENTS

JP    63-178248 A    7/1988
(Continued)

OTHER PUBLICATIONS

Machine Translation of JP 08-068990 to Masaaki et al, Mar. 12, 1996.*
(Continued)

*Primary Examiner* — D. S. Nakarani
(74) *Attorney, Agent, or Firm* — Buchanan Ingersoll & Rooney PC

(57) ABSTRACT

The bonding method of the present invention is a method of bonding a member (a) having a layer (a1) comprising an organic polymer (A), and a member (b) containing a compound (B) having specific functional groups, wherein the bonding method comprises bonding the member (a) and the member (b) via a layer comprising an inorganic compound (C) having a nitrogen atom and a hydrogen atom, which is at least partly provided on the outermost surface of the member (a).

The composite film of the present invention is, firstly, a composite film formed with a laminate having a layer (a1) comprising an organic polymer (A) and a layer (c1) comprising an inorganic compound (C) having a nitrogen atom and a hydrogen atom; secondly, a composite film formed with a laminate having the layer (a1), the layer (c1) and a layer (b1) comprising an adhesive resin (B1) disposed in this order, wherein the layer (c1) and the layer (b1) are directly laminated; and thirdly, a composite film formed with a laminate having the layer (a1), the layer (c1), and a transparent conductive layer (d1) disposed in this order, wherein one outermost surface or both outermost surfaces of the composite film are partially formed with the layer (c1).

16 Claims, 1 Drawing Sheet

U.S. PATENT DOCUMENTS

| | | | |
|---|---|---|---|
| 5,508,368 A | 4/1996 | Knapp et al. | |
| 2002/0016084 A1 | 2/2002 | Todd | |

FOREIGN PATENT DOCUMENTS

| | | | |
|---|---|---|---|
| JP | 04-206760 A | 7/1992 |
| JP | 05-254053 A | 10/1993 |
| JP | 08-068990 A | 3/1996 |
| JP | 10-500633 A | 1/1998 |
| JP | 11-048388 A | 2/1999 |
| JP | 11-279519 A | 10/1999 |
| JP | 2001-315276 A | 11/2001 |
| JP | 2001-358139 A | 12/2001 |
| JP | 2002-100469 A | 4/2002 |
| JP | 2002-321311 A | 11/2002 |
| JP | 2003-053881 A | 2/2003 |
| JP | 2004-276564 A | 10/2004 |
| JP | 2004-315899 A | 11/2004 |
| JP | 2004-330623 A | 11/2004 |
| WO | WO 95/23652 A1 | 9/1995 |

OTHER PUBLICATIONS

Minoru Hiramatsu et al., "Chemistry of Surface Analysis/Modification", The Adhesion Society of Japan, Nikkan Kogyo Shimbun, Ltd., 2003, pp. 102, 103, 116, 117, 202, 1st Edition, partial English translation.

* cited by examiner

METHOD FOR BONDING MEMBERS, COMPOSITE FILM AND USE THEREOF

TECHNICAL FIELD

The present invention relates to a method for firmly bonding members that are difficult to be bonded, including polyolefin members, and to parts, elements and the like produced by using the bonding method.

The present invention also relates to a composite film suitable for a sealing method employing the bonding method, and more particularly, to a sealant film adhered by using an adhesive resin, or a transparent conductive film suitable for adhesion using an adhesive resin. Even more particularly, the present invention relates to a sealant film that is used for electronic and electric parts including display elements and the like, or a transparent conductive film that is favorably used for electronic and electric parts including display elements and the like, and various uses thereof.

BACKGROUND ART

The recent development of portable electronic and electric instruments based on the progress to a ubiquitous society, size enlargement of display instruments and the like have resulted in a tendency to use films made of organic polymers as a material for element substrates including transparent conductive substrates, or for sealant members, instead of glass substrates, and therefore weight reduction and thickness reduction (slimming) of the instruments are desired. In this case, the films made of organic polymers are required to have high gas barrier performance against steam, oxygen and the like in order to maintain the reliability of electronic and electric parts including display elements and the like, and optical parts, and when used for the display parts of display elements, the films are further required to have high transparency in order to maintain visibility. Thus, various techniques such as laminating a transparent inorganic film on a film comprising an organic polymer, or laminating an organic layer and an inorganic layer, have been investigated (See, for example, Patent Document 1 and Patent Document 2).

When a film made of an organic polymer and having an inorganic film or the like laminated thereon is used as a sealant member for bonding with an adhesive resin in electronic and electric parts including display elements and the like, it is desirable that the sealant film and the adhesive resin are bonded uniformly and firmly, in order to prevent delamination of the sealant film and the like that is caused by environmental changes during product manufacturing processes after bonding of the sealant film or use of such product as well as to secure high gas barrier property and transparency of the sealant film itself.

Furthermore, with regard to the transparent conductive substrate, for example, in the case of electronic paper, organic EL, liquid crystals or the like, it is commonly practiced that a transparent conductive layer on a film substrate is processed by lithography, etching or the like to form a wiring pattern, and then bonded to a counter-substrate, a rib or the like with an adhesive resin.

Therefore, when a transparent conductive film on which a wiring pattern formed from such transparent conductive layer or the like is formed, is bonded to another member (which constitutes an electronic or electric parts including a display element or the like) by means of an adhesive resin, it is desirable that the transparent conductive film and the adhesive resin are bonded uniformly and firmly, in order to prevent delamination of the transparent conductive film and the like due to environmental changes during product manufacturing processes after bonding or use of such product.

So far, it has been reported that the adhesiveness of the surface of an organic polymeric body is enhanced when the superficial groups of the organic polymeric body are modified through UV ozone treatment, corona discharge treatment or plasma treatment of the surface of the organic polymeric body for the purpose of improving the adhesiveness of the surface of the organic polymeric body and the adhesive resin. However, these modified superficial groups of the organic polymeric body infiltrate into the organic polymeric body under the effect of external environment, and as a result, there occurs a problem of deterioration of the adhesive strength to the adhesive resin over the standing time after the surface treatment of the organic polymeric body (See, for example, Non-patent Document 1).

In addition, patterning of the transparent conductive layer is frequently performed upon the formation of target elements, but there are cases where UV ozone treatment, corona discharge treatment, plasma treatment or the like cannot be carried out in some element forming processes.

By the way, compounds (including resins; hereinafter, the same) having isocyanate groups, carboxyl groups, or cyclic ether groups including epoxy groups are known to be useful for the bonding, that is, adhesion, coating, painting and the like, of various members (See, for example, Patent Document 3). These compounds have excellent bondability to various materials and are widely used in many fields such as adhesion, painting, coating and the like, based on this bondability. However, depending on the material of the counterpart, sufficient bondability is hardly expected. For example, in the case of adhering polyolefins, there were cases where sufficient adhesive strength could not be secured. In particular, there are many polyolefins, including cycloolefin (co)polymers and 4-methyl-1-pentene (co)polymers, that are difficult to be adhered, and there were cases where good adhesion could not be necessarily achieved even through the use of those compounds having the above-described functional groups.

Moreover, as described in Patent Document 1 and 2 described above, it is already known, with regard to films comprising organic polymers, to laminate layers comprising inorganic compounds including silicon oxide, silicon nitride or silicon oxynitride on the films comprising organic polymers.

For example, it is already known to form layers comprising inorganic compounds having nitrogen atoms, on the surfaces of various resins such as polyolefins. However, the main purpose of forming such layers is to enhance the gas barrier property, but investigation on the effect of the layers comprising nitrogen-atom-containing inorganic compounds on the adhesiveness of the resins has not been sufficiently achieved. Because of that, in conventional cases, bonding to an adhesive resin or the like has been carried out only after providing a coating layer comprising an inorganic oxide such as oxide of indium and tin, on the layer comprising a nitrogen-atom-containing inorganic compound such as silicon oxynitride (See, for example, Patent Document 4). This is because it is known that the adhesiveness to an adhesive resin is improved by forming a layer comprising an inorganic oxide on the surface of a molded product of organic polymer (See, for example, Patent Document 5).

However, although the adhesiveness to an adhesive resin is improved by forming a layer comprising an inorganic oxide film on the surface of the molded product of organic polymer, the adhesiveness was not necessarily sufficient in view of the purpose of the film. In particular, with regard to the uses in electronic and electric parts including display elements and the like, it is highly required to sufficiently seal the interior of the packages, cells and the like, and thus it is needed to materialize a sealant film having improved adhesiveness compared with the cases of using conventional inorganic oxide films.

In addition, it is already known to produce a transparent conductive film by laminating a layer comprising an inorganic compound such as silicon oxide, silicon nitride or silicon oxynitride on a film substrate comprising an inorganic polymer, and then forming a transparent conductive layer thereon. However, the main purpose of forming such layers is to enhance the gas barrier property and to improve the close adherence of the transparent conductive layer and the film substrate, and investigation on the adhesiveness of the layer comprising an inorganic compound and the adhesive resin (that is used for the bonding with other members) has not been sufficiently achieved (See, for example, Patent Document 6).

That is, there were cases where the adhesiveness between the transparent conductive film and the adhesive resin or the like as described above was not necessarily sufficient in view of the purpose of the film. Especially in the case where the organic polymer used for the film substrate was a polyolefin (in particular, cycloolefin (co)polymer), PET or the like, bonding of the transparent conductive film and the adhesive resin was not necessarily easy in many cases, and this caused limited use of transparent conductive films employing such substrates.

There is also known a substrate for transparent electrode in which one or more of each of nitride layers and oxide layers are laminated on a transparent substrate such as polyethersulfone, and then a transparent polymer layer such as silicone resin is laminated thereon. However, the main purpose of forming such layers is to improve the gas barrier property and the steam barrier property, and an investigation on the adhesiveness between these layers comprising inorganic compounds and the adhesive resin (that is used for bonding to other members) is not sufficiently achieved (See Patent Document 7).

Meanwhile, a laminate having an epoxy resin adhered on the surface of a body to be bonded via a silicon nitride film is known, and it is reported to enhance the adhesive strength under hygroscopic and high temperature conditions by forming a silicon nitride film on the surface of the body to be bonded and then adhering the resulting body to another member using an epoxy resin (See Patent Document 8). In this report, it is described that the body to be bonded may be a resin material, but in practice, the effect is merely confirmed in metallic materials, specifically iron and copper metals.

Patent Document 1; JP-A No. 2002-100469
Patent Document 2; JP-A No. 2004-330623
Patent Document 3; JP-A No. 11-279519
Patent Document 4; JP-A No. 2001-315276
Patent Document 5; JP-A No. 4-206760
Patent Document 6; JP-A No. 11-048388
Patent Document 7; JP-A No. 8-68990
Patent Document 8; JP-A No. 5-254053
Non-patent Document 1; "Chemistry of Surface Analysis-Modification", The Adhesion Society of Japan, Nikkan Kogyo Shimbun, Ltd. (1$^{st}$ Edition published in 2003)

DISCLOSURE OF THE INVENTION

Object of the Invention

It is the first object of the present invention to enhance adhesiveness, coating property, painting property and the like of members that are difficult to be bonded, by improving the adhesiveness between a member comprising the above-described compound having an isocyanate group, a carboxyl group or a cyclic ether group including an epoxy group, and a member comprising a material having insufficient bondability to such a resin (in particular, a polyolefin resin).

It is the second object of the present invention to provide a composite film which is used in electronic and electric parts including display elements and the like, or optical parts and the like, and is suitable for bonding by means of an adhesive resin, particularly in the field of sealant films employing film substrates comprising organic polymers, to provide a sealant film which has high gas barrier property as well as good adhesiveness of the sealant film to the adhesive resin.

It is the third object of the present invention to provide a composite film which is favorably used in electronic and electric parts including display elements and the like and is suitable for bonding by means of an adhesive resin, particularly in the field of transparent conductive films employing film substrates comprising organic polymers, to provide a transparent conductive film having good adhesiveness of the transparent conductive film to the adhesive resin.

Means to Attain the Object

The inventors have devotedly studied, and as a result, found that a member provided on its outermost surface with a layer comprising an inorganic compound having nitrogen and hydrogen atoms, has good adhesiveness to a compound having at least one group selected from the group consisting of an isocyanate group, a carboxyl group and a cyclic ether group, and that a composite film (for example, a sealant film) having high gas barrier property and good adhesiveness to an adhesive resin can be obtained by forming at least one outermost surface of the composite film with a layer comprising an inorganic compound having nitrogen and hydrogen atoms, in other words, good adhesiveness is obtained between the adhesive resin and the layer comprising an inorganic compound having nitrogen and hydrogen atoms, thus completing the present invention.

Thus, the present invention relates to the following terms of [1], [15], [16] and [21], while the particulars of [2] to [14], [17] to [20], and [22] to [27] are each a preferred embodiment of the present invention. Further, in the following description, the term "a layer comprising an organic polymer" is meant to include both the case where the entirety of the "layer" is composed of the "organic polymer", and the case where a part of the "layer" is composed of the "organic polymer". The term "a layer comprising an inorganic compound" is meant to include both the case where the entirety of the "layer" is composed of the "inorganic compound", and the case where a part of the "layer" is composed of the "inorganic compound".

[1] A bonding method of bonding a member (a) having a layer (a1) comprising an organic polymer (A), and a member (b) containing a compound (B) having at least one functional group selected from the group consisting of an isocyanate group, a carboxyl group and a cyclic ether group, wherein the bonding method comprises bonding the member (a) and the member (b) via a layer comprising an inorganic compound (C) having a nitrogen atom and a hydrogen atom, which is provided on at least a part of the outermost surface of the member (a).

[2] The bonding method as described in [1] above, wherein at least a part of the layer (a1) comprising organic polymer (A) in the member (a) is in direct contact with the layer comprising inorganic compound (C).

[3] The bonding method as described in [1] above, wherein after the implementation of the bonding method, at least a part of the member (b) is directly bonded to the layer comprising inorganic compound (C) of the member (a).

[4] The bonding method as described in [1] above, wherein after the implementation of the bonding method, there exists at least one region having the layer (a1) comprising organic polymer (A) of the member (a), the layer comprising inorganic compound (C) of the member (a), and the member (b) disposed in this order and directly bonded.

[5] The bonding method as described in any one of [1] to [4] above, wherein the compound (B) having at least one functional group selected from the group consisting of an isocyanate group, a carboxyl group and a cyclic ether group, is a compound having at least an epoxy group.

[6] The bonding method as described in any one of [1] to [4] above, wherein the inorganic compound (C) having a nitrogen atom and a hydrogen atom further has a silicon atom, and the ratio of the number of the nitrogen atoms/the number of the silicon atoms is in the range of from 0.01 to 2.

[7] The bonding method as described in any one of [1] to [4] above, wherein the organic polymer (A) is a polyolefin.

[8] The bonding method as described in [7] above, wherein the polyolefin is obtained by using at least one monomer selected from 4-methyl-1-pentene and olefins having a cyclic structure, as a (co)polymerization component.

[9] A sealing method using the bonding method as described in any one of [1] to [8] above.

[10] A composite film produced by using the bonding method as described in any one of [1] to [8] above.

[11] An optical part produced by using the bonding method as described in any one of [1] to [8] above.

[12] An electronic or electric part produced by using the bonding method as described in any one of [1] to [8] above.

[13] An electronic or electric instrument or a transport machine having the optical part as described in [11] above and/or the electronic or electric part as described in [12] above.

[14] A method for producing an optical part or an electronic or electric part, comprising the step of using the bonding method as described in any one of [1] to [8] above.

[15] A composite film comprising a laminate having a layer (a1) comprising an organic polymer (A), and a layer (c1) comprising an inorganic compound (C) having a nitrogen atom and a hydrogen atom, wherein at least one outermost surface is formed with the layer (c1) comprising the inorganic compound (C) having a nitrogen atom and a hydrogen atom.

[16] A composite film comprising a laminate having a layer (a1) comprising an organic polymer (A), a layer (c1) comprising an inorganic compound (C) having a nitrogen atom and a hydrogen atom, and a transparent conductive layer (d1) disposed in this order, wherein part of one or both outermost surfaces of the composite film is formed with the layer (c1) comprising inorganic compound (C) having a nitrogen atom and a hydrogen atom.

[17] The composite film as described in [15] or [16] above, wherein the organic polymer (A) is a polyolefin, and is obtained by using at least one monomer selected from ethylene, propylene, 1-butene, 4-methyl-1-pentene and cycloolefins, as a (co)polymerization component.

[18] The composite film as described in [15] or [16] above, wherein the organic polymer (A) is obtained by (co)polymerizing at least one cycloolefin.

[19] The composite film as described in [15] or [16] above, wherein the inorganic compound (C) having a nitrogen atom and a hydrogen atom further has a silicon atom.

[20] A sealing method comprising the step of:

bonding directly the composite film as described in any one of [15] to [19] above to an adhesive resin (B1), at the part of the composite film where the layer (c1) comprising the inorganic compound (C) having a nitrogen atom and a hydrogen atom forms the outermost surface.

[21] A composite film comprising a laminate having a layer (a1) comprising an organic polymer (A), a layer (c1) comprising an inorganic compound (C) having a nitrogen atom and a hydrogen atom, and a layer (b1) comprising an adhesive resin (B1) disposed in this order, wherein the layer (c1) comprising the compound (C) having a nitrogen atom and a hydrogen atom, and the layer (b1) comprising adhesive resin (B1) are directly laminated.

[22] The composite film as described in [21] above, wherein the organic polymer (A) is a polyolefin, and is obtained by using at least one monomer selected from ethylene, propylene, 1-butene, 4-methyl-1-pentene and cycloolefins, as a (co)polymerization component.

[23] The composite film as described in [21] above, wherein the organic polymer (A) is obtained by (co)polymerizing at least one cycloolefin.

[24] The composite film as described in [21] above, wherein the inorganic compound (C) having a nitrogen atom and a hydrogen atom further has a silicon atom.

[25] An optical parts comprising the composite film as described in any one of [15] and [21] to [24] above.

[26] An electronic or electric part comprising the composite film as described in any one of [15] to [19] and [21] to [24] above.

[27] An electronic or electric instrument or a transport machine having the optical part as described in [25] and/or the electronic or electric part as described in [26].

Effect of the Invention

According to the bonding method of the present invention, it is possible to bond favorably a member comprising a compound having an isocyanate group, a carboxyl group or a cyclic ether group including an epoxy group, with a member comprising a variety of materials which have been traditionally difficult to be bonded, particularly a resin such as polyolefin. The bonding method (adhesion, coating, painting, etc.) and a bonded article (adhered article, coated article, painted article, etc.) such as a composite film produced by the bonding method are very useful in the fields of optical parts, electronic and electric parts (including display elements, flat panel displays, organic EL elements, etc.), and the like.

By means of the composite film, for example, the sealant film, of the present invention, the gas barrier property of the sealant film itself is excellent, and the sealant film can form uniform and simultaneously firm bonding with an adhesive resin, thus it being possible to prevent deterioration of the gas barrier property due to the delamination between the sealant film and the adhesive resin. Therefore, the sealant film is very useful in the field of electronic and electric parts (including display elements, organic EL elements, etc.), and the like.

Further, by means of the composite film, for example, the transparent conductive film, of the present invention, it is possible to uniformly and firmly bond a patterned transparent conductive film and an adhesive resin, and thereby to prevent delamination between the transparent conductive film and the adhesive resin. Therefore, the transparent conductive film is very useful in the field of electronic and electric parts (including display elements, electronic paper, etc.) and the like.

ILLUSTRATION OF THE SYMBOLS

Figure 1:
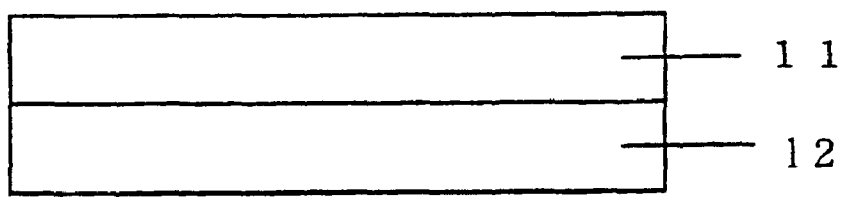
FIG. 1 is a cross-sectional view briefly illustrating the structure of an exemplary member (a) used for the bonding method of the present invention, or the structure of a preferred embodiment of the composite film of the present invention (a first sealant film)

11: film substrate
12: silicon nitride film
11: ITO film

BEST MODE FOR CARRYING OUT THE INVENTION

Hereinafter, the present invention will be explained in detail.
<Bonding Method>

The bonding method of the present invention is a method of bonding one member (a), preferably a member (a) having a layer (a1) comprising an organic polymer (A), and another member (b) containing a compound (B) having at least one group selected from the group consisting of an isocyanate group, a carboxyl group and a cyclic ether group, wherein the bonding method comprises bonding the member (a) and the member (b) via a layer comprising an inorganic compound (C) having nitrogen and hydrogen atoms, which is provided on one outermost surface of the member (a).

The principle of the bonding method of the present invention is currently under examination and yet to be confirmed; however, the principle is believed to be basically as follows.

The bonding method of the present invention is believed to be a method of bonding by the action of the nitrogen atom, or an atom directly bound to the nitrogen atom, of the inorganic compound (C) having nitrogen and hydrogen atoms which is present at the outermost surface of the member (a), with the functional group carried by the member (b). The term action as used herein means generation of a hydrogen bond, an ionic bond and/or a covalent bond, preferably a covalent bond. It is also believed that the intervention of the nitrogen atom or the atom directly bound to the nitrogen atom catalytically activates another functional group, for example, a hydroxyl group and the like, on the outermost surface of the member (a) and the functional group of the member (b), thereby enhancing the above-described action, and this is also believed to contribute to the effect of the present invention.

The reaction involving the nitrogen atom will be described herein. It is expected that, for example, when there is an amino group on the outermost surface of the inorganic compound (C) of the member (a) containing nitrogen and hydrogen atoms, and there is a cyclic ether group in the member (b), there occurs a ring-opening addition reaction, and the member (a) and the member (b) are firmly bonded by covalent bond. Likewise, when there is an amino group in the member (a), and there is an isocyanate group in the member (b), a urea bond is produced and likewise results in covalent bond. Likewise, when there is a carboxyl group derived from a carboxylic acid or an acid anhydride in the member (b), production of an amide bond with an amino group is expected.

Next, the case of enhancing the above-described effect as a result of intervention of a nitrogen atom, or an atom directly bound to a nitrogen atom, whereby catalytically activating other functional groups, such as a hydroxyl group, on the outermost surface of the member (a) and the functional groups in the member (b), will be described. If a member (b) contains a cationic polymerizable component such as a cyclic ethers, a nitrogen atom or an atom directly bound to a nitrogen atom in a member (a) exhibits a catalytic action which effectively causes termination reaction of the cationic polymerization, and the termination reaction between the hydroxyl group on the outermost surface of the member (a) and the growing terminals of the cationic polymerization of the member (b) takes place effectively, thereby bonding of the member (a) and the member (b) through covalent bond being expected.

The individual members will be described in the following.

With regard to the bonding method of the present invention, the shape of the member (a) is not particularly limited, and may be any shape that is capable of bonding with other members, such as film, sheet, molding product or the like. The member (a) has a layer (a1) comprising an organic polymer (A), but the material used in this layer (a1) (hereinafter, may be referred to as "substrate") is not particularly limited, as long as the material contains the organic polymer (A). Therefore various materials having shape fixability to an extent that bonding with other members is possible, can be used for the member (a). In the case of using a material having poor direct bondability to the member (b), the effect of the present invention would be particularly remarkable; however, even in the case of using a material capable of direct bonding with the member (b), the present invention may be advantageous.

Here, the thickness of the layer (a1) is not particularly limited, and the thickness is not a factor restricting the conditions for the use as a "layer." The shape of the layer (a1) is also not particularly limited, and the shape, particularly the ratio of the thickness and the area, is not a factor restricting the conditions for the use as a "layer."

The substrate of the member (a) may consist of a material of only one type, or may consist of materials of two or more types. When the member (a) consists of two or more materials, they may be uniformly mixed and dispersed into each other, or may be non-uniformly distributed.

Further, in the bonding method of the present invention, the member (a) has a layer comprising an inorganic compound (c) having nitrogen and hydrogen atoms on the outermost surface. Therefore, when the member (a) and the member (b) are bonded according to the present invention, the layer of the member (a) comprising the inorganic compound (C) having nitrogen and hydrogen atoms is bonded to the member (b). The term "bonding" as used in the present description refers to a state that two members are jointed at their respective surfaces so that the mutual positional relation of the two members is fixed.

According to the bonding as used herein, the member (a) and the member (b) are bonded via the layer of the inorganic compound having nitrogen and hydrogen atoms of the member (a). As an application example, the member (b) can be used as an adhesive to fix a member (a) and another member (a), or as an adhesive to fix a member (a) to another member of different material, such as metal, ceramic, glass or other plastic material. It is also possible to use the member (b) as a primer layer to enhance close adherence between the member (a) and a coated film in the case of painting or coating of the member (a). The member (b) can also function by itself as a coated film. Further, the member (b) can be used to coat a film comprising member (a).

According to the bonding method of the present invention, the outermost layer of the member (a) may be entirely composed of an inorganic compound (C) having nitrogen and hydrogen atoms, or may be partially composed of an inorganic compound (C) having nitrogen and hydrogen atoms (that is, the outermost layer may contain components other than the inorganic compound having nitrogen and hydrogen atoms). The layer constitution of the member (a) according to the bonding method of the present invention is not particularly limited, as long as the member (a) has a layer comprising an inorganic compound (C) having nitrogen and hydrogen atoms at least partly on the outermost layer. That is, the layer comprising the inorganic compound (C) having nitrogen and hydrogen atoms may be laminated directly on the substrate of the member (a), or may be laminated on one or two or more intermediate layers.

The outermost surface of the member (a) according to the bonding method of the present invention may be only partially covered with the layer comprising the inorganic compound (C) having nitrogen and hydrogen atoms, or may be entirely covered with the layer comprising the inorganic compound (C) having nitrogen and hydrogen atoms. Therefore, in the case where the member (a) is a film, the entirety of both surfaces of the film may be covered with the layer comprising the inorganic compound (C) having nitrogen and hydrogen atoms; the entirety of only one surface of the film may be covered with the inorganic compound (C) having nitrogen and hydrogen atoms; only parts of both surfaces of the film may be covered with the layer comprising the inorganic compound (C) having nitrogen and hydrogen atoms; or a part of only one surface of the film may be covered with the layer comprising the inorganic compound (C) having nitrogen and hydrogen atoms.

According to the bonding method of the present invention, the shape of the member (b) is also not particularly limited, and may be any shape capable of bonding with other members, such as film, sheet, molded product, liquid, viscous liquid. For example, bonding to member (a) by lamination may be favorably done with a shape of film or sheet, while painting member (a) with member (b), or adhering member (a) to another member by means of member (b), may be favorably done with a liquid or a viscous liquid. Furthermore, as long as the member (b) contains a compound having at least one group selected from the group consisting of an isocyanate group, a carboxyl group and a cyclic ether group, the entirety of the member (b) may be composed of the compound having at least one group selected from the group consisting of an isocyanate group, a carboxyl group and a cyclic ether group, or a part of the member (b) may be composed of the compound having at least one group selected from the group consisting of an isocyanate group, a carboxyl group and a cyclic ether group. The compound as used herein is not particularly limited in the degree of polymerization or the molecular weight, and may be any of a monomer, a dimer, an oligomer, a prepolymer and a polymer (with a high degree of polymerization).

The carboxyl group and the isocyanate group as used herein may be present in the member (b) as they are, but generation of the groups under external stimuli such as heat, light or water may be also helpful to the present invention. As an example thereof, mention may be made of block urethanes, which generate isocyanate groups upon dissociation caused, by heat, or photoacid generators. For the carboxyl group, acid anhydrides also belong to the carboxyl group of the present invention.

As the inorganic compound (C) having nitrogen and hydrogen atoms according to the bonding method of the present invention, the hydrogenation products of the inorganic compounds containing nitrogen atoms, such as silicon nitride, silicon oxynitride or aluminum nitride are preferably used, but the hydrogenation products of various nitrogen compounds other than the listed examples may also be appropriately used. The method of introducing these inorganic compounds (C) to the member (a) is not particularly limited, but the method of introducing an inorganic compound (C) to the surface in contact with the member (b) is most preferred. For example, surface treatment methods such as vapor deposition, flame treatment, plasma treatment and CVD (chemical vapor deposition) are preferably used, and CVD is particularly preferred.

Hereinafter, the materials that can be used for the respective members will be further explained in detail.

(Member (a))

(Substrate of the Member (a))

As described above, the material that can be used for member (a) is not particularly limited as long as the material has a layer (a1) comprising an organic polymer (A), and in view of the purpose of the present invention, organic materials such as resins and rubber, metallic materials such as gold, copper and tungsten, and inorganic materials such as glass, ceramics and single crystals can be appropriately selected and used. Among these, particularly preferred are organic materials, and resins comprising organic polymers are particularly preferably used.

According to the bonding method of the present invention, there is no particular limitation in the resin comprising organic polymer that is preferably used for the member (a) and the layer (a1), and polyolefin, polyamide (PA), polyacetal (POM), polybutylene terephthalate (PBT), polyethylene terephthalate (PET), syndiotactic polystyrene (SPS), polyphenylene sulfide (PPS), polyether ether ketone (PEEK), liquid crystalline polymers (LCP), fluorinated resins, polyethernitrile (PEN), polycarbonate (PC), modified polyphenylene ether (mPPE), polysulfone (PSF), polyether sulfone (PES), polyarylate (PAR), polyamideimide (PAI), polyetherimide (PEI), thermoplastic polyimide (PI) and the like can be preferably used.

Among these various resins, polyolefins and polyethylene terephthalate (PET) that are well balanced in mechanical properties, optical properties and costs and the like are particularly preferably used. The polyolefins that are preferably used according to the bonding method of the present invention are not particularly limited, but polyolefins obtained by using at least one monomer selected from ethylene, propylene, 1-butene, 4-methyl-1-pentene and olefins having cyclic structures as the (co)polymerizable component being particularly well balanced in mechanical properties, optical properties and costs and the like are particularly preferably used. Furthermore, these resins may not necessarily have sufficient adhesiveness, and thus in many cases, applying the bonding method of the present invention may have particular significance.

Among the various polyolefins obtained by using the specific monomers described above as the (co)polymerizable component, cycloolefin (co)polymers and 4-methyl-1-pentene (co)polymers are particularly preferably used for the bonding method of the present invention.

A cycloolefin (co)polymer as used herein is a polymer obtained by using an olefin having a cyclic structure at least as a part of the (co)polymerizable component. The cycloolefin (co)polymers have excellent properties such as excellent optical properties, high gas barrier property, or low water absorbability, but are not necessarily satisfactory in the properties such as brittleness or weather resistance, thus the (co)polymers being required to be bonded with other resins by lamination or the like for use. However, adhesion of cycloolefin (co)polymers is not necessarily easy, and thus excellent adhesion methods are required. Accordingly, when cycloolefin (co)polymers are used for the member (a), particularly for the layer (a1), of the present invention, the effect of the present invention can be particularly significantly utilized.

Specific examples of the cycloolefin (co)polymers include (1) norbornene polymers (2) monocyclic cycloolefinic polymers, and hydrogenation products thereof. Among these, from the viewpoints of dimensional stability, heat resistance, mechanical strength and the like, norbornene polymers and hydrogenation products thereof are preferred.

(1) Norbornene Polymer

Examples of the norbornene polymer that can be used for the bonding method of the present invention include the ring-opening polymers of norbornene monomers, the ring-opening copolymers of norbornene monomers and other monomers that are capable of ring-opening copolymerization with the norbornene monomers, and hydrogenation products thereof; addition polymers of norbornene monomers, addition copolymers of norbornene monomers and other monomers that are copolymerizable with the norbornene monomers, and the like. Among these, from the viewpoint of heat resistance, mechanical strength and the like, the hydrogenation products of the ring-opening polymers of norbornene monomers, and the addition copolymers of norbornene monomers and other monomers that are copolymerizable with norbornene monomers are most preferred.

Preferred examples of the norbornene monomer include bicyclo[2.2.1]-hept-2-ene (trivial name: norbornene), 5-methyl-bicyclo[2.2.1]-hept-2-ene, 5,5-dimethyl-bicyclo[2.2.1]-hept-2-ene, 5-ethyl-bicyclo[2.2.1]-hept-2-ene, 5-butyl-bicyclo[2.2.1]-hept-2-ene, 5-hexyl-bicyclo[2.2.1]-hept-2-ene, 5-octyl-bicyclo[2.2.1]-hept-2-ene, 5-octadecyl-bicyclo[2.2.1]-hept-2-ene, 5-ethylidene-bicyclo[2.2.1]-hept-2-ene, 5-methylidene-bicyclo[2.2.1]-hept-2-ene, 5-vinyl-bicyclo[2.2.1]-hept-2-ene, 5-propenyl-bicyclo[2.2.1]-hept-2-ene, 5-methoxycarbonyl-bicyclo[2.2.1]-hept-2-ene, 5-cyano-bicyclo[2.2.1]-hept-2-ene, 5-methyl-5-methoxycarbonyl-bicyclo[2.2.1]-hept-2-ene, 5-methoxycarbonyl-bicyclo[2.2.1]-hept-2-ene, 5-ethoxycarbonyl-bicyclo[2.2.1]-hept-2-ene, 5-methyl-5-ethoxycarbonyl-bicyclo[2.2.1]-hept-2-ene, bicyclo[2.2.1]-hept-5-enyl-2-methyl propionate, bicyclo[2.2.1]-hept-5-enyl-2-methyl octanate, bicyclo[2.2.1]-hept-2-ene-5,6-dicarboxylic anhydride, 5-hydroxymethyl-bicyclo[2.2.1]-hept-2-ene, 5,6-di(hydroxymethyl)-bicyclo[2.2.1]-hept-2-ene, 5-hydroxy-1-propyl-bicyclo[2.2.1]-hept-2-ene, bicyclo[2.2.1]-hept-2-ene, 5,6-dicarboxy-bicyclo[2.2.1]-hept-2-ene, bicyclo[2.2.1]-hept-2-ene-5,6-dicarboxylic acid imide, 5-cyclopentyl-bicyclo[2.2.1]-hept-2-ene, 5-cyclohexyl-bicyclo[2.2.1]-hept-2-ene, 5-cyclohexenyl-bicyclo[2.2.1]-hept-2-ene, 5-phenyl-bicyclo[2.2.1]-hept-2-ene, tricyclo[4.3.1$^{2,5}$.0$^{1,6}$]-deca-3,7-diene (trivial name: dicyclopentadiene), tricyclo[4.3.1$^{2,5}$.0$^{1,6}$]-deca-3-ene, tricyclo[4.4.1$^{2,5}$.0$^{1,6}$]-undeca-3,7-diene, tricyclo[4.4.1$^{2,5}$.0$^{1,6}$]-undeca-3,8-diene, tricyclo[4.4.1$^{2,5}$.0$^{1,6}$]-undeca-3-ene, tetracyclo[7.4.1$^{10,13}$.0$^{1,9}$.0$^{2,7}$]-trideca-2,4,6-11-tetraene (also called 1,4-methano-1,4,4a,9a-tetrahydrofluorene; trivial name: methanotetrahydrofluorene), tetracyclo[8.4.1$^{11,14}$.0$^{1,10}$.0$^{3,8}$]-tetradeca-3,5,7,12-11-tetraene (also called 1,4-methano-1,4,4a,5,10,10a-hexahydroanthracene), tetracyclo[4.4.1$^{2,5}$.1$^{7,10}$.0]-dodeca-3-ene (also called tetracyclododecene), 8-methyl-tetracyclo[4.4.1$^{2,5}$.1$^{7,10}$.0]-dodeca-3-ene, 8-ethyl-tetracyclo[4.4.1$^{2,5}$.1$^{7,10}$.0]-dodeca-3-ene, 8-methylidene-tetracyclo[4.4.1$^{2,5}$.1$^{7,10}$.0]-dodeca-3-ene, 8-ethylidene-tetracyclo[4.4.1$^{2,5}$.1$^{7,10}$.0]-dodeca-3-ene, 8-vinyl-tetracyclo[4.4.1$^{2,5}$.1$^{7,10}$.0]-dodeca-3-ene, 8-propenyl-tetracyclo[4.4.1$^{2,5}$.1$^{7,10}$.0]-dodeca-3-ene, 8-methoxycarbonyl-tetracyclo[4.4.1$^{2,5}$.1$^{7,10}$.0]-dodeca-3-ene, 8-methyl-8-methoxycarbonyl-tetracyclo[4.4.1$^{2,5}$.1$^{7,10}$.0]-dodeca-3-ene, 8-hydroxymethyl-tetracyclo[4.4.1$^{2,5}$.1$^{7,10}$.0]-dodeca-3-ene, 8-carboxy-tetracyclo[4.4.1$^{2,5}$.1$^{7,10}$.0]-dodeca-3-ene, 8-cyclopentyl-tetracyclo[4.4.1$^{2,5}$.1$^{7,10}$.0]-dodeca-3-ene, 8-cyclohexyl-tetracyclo[4.4.1$^{2,5}$.1$^{7,10}$.0]-dodeca-3-ene, 8-cyclohexenyl-tetracyclo[4.4.1$^{2,5}$.1$^{7,10}$.0]-dodeca-3-ene, 8-phenyl-tetracyclo[4.4.1$^{2,5}$.1$^{7,10}$.0]-dodeca-3-ene, pentacyclo[6.5.1$^{1,8}$.1$^{3,6}$.0$^{2,7}$.0$^{9,13}$]-pentadeca-3,10-diene, pentacyclo[7.4.1$^{3,6}$.1$^{10,13}$.0$^{1,9}$.0$^{2,7}$]-pentadeca-4,11-diene and the like, but the examples are not limited to these. These norbornene monomers are used individually or in combination of two or more species.

The ring-opening polymers of these norbornene monomers, or the ring-opening copolymers of norbornene monomers and other monomers that are capable of ring-opening copolymerization with norbornene monomers can be obtained by polymerizing the monomer components in the presence of a ring-opening polymerization catalyst. Examples of the ring-opening polymerization catalyst that can be used include catalysts comprising halides, nitrates or acetylacetone compounds of metals such as ruthenium, rhodium, palladium, osmium, iridium or platinum, and reducing agents, or catalysts comprising halides or acetylacetone compounds of metals such as titanium, vanadium, zirconium, tungsten or molybdenum, and organic aluminum compounds. The polymerization reaction is carried out in the presence or absence of solvent, usually at a polymerization temperature of $-50°$ C. to $100°$ C., and at a polymerization pressure of 0 to 50 kg/cm$^2$. Examples of the other monomers that are capable of ring-opening copolymerization with norbornene monomers include monocyclic cycloolefinic monomers such as cyclohexene, cycloheptene and cyclooctene, and the like, but are not limited to these.

The hydrogenation products of the ring-opening polymers of norbornene monomers can be usually obtained by adding a hydrogenation catalyst to a polymerization solution of the ring-opening polymer, and hydrogenating the carbon-carbon unsaturated bonds. The hydrogenation catalyst is not particularly limited, but usually heterogeneous catalysts or homogeneous catalysts are used.

Addition (co)polymers of norbornene monomers or of norbornene monomers and other monomers that are copolymerizable therewith can be obtained by, for example, (co)polymerizing the monomer components in the presence or absence of solvent, in the presence of a catalyst comprising a titanium, zirconium or vanadium compound and an organic aluminum compound, usually at a polymerization temperature of $-50°$ C. to $100°$ C. and at a polymerization pressure of 0 to 50 kg/cm$^2$.

Examples of the other monomers that are copolymerizable with norbornene monomers include α-olefins having 2 to 20 carbon atoms such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene and 1-eicosene; cycloolefins such as cyclobutene, cyclopentene, cyclohexene, 3,4-dimethylcyclopentene, 3-methylcyclohexene, 2-(2-methylbutyl)-1-cyclohexene, cyclooctene and 3a,5,6,7a-tetrahydro-4,7-methano-1H-indene; non-conjugated dienes such as 1,4-hexadiene, 4-methyl-1,4-hexadiene, 5-methyl-1,4-hexadiene and 1,7-octadiene; and the like, but are not limited to these. Among these, α-olefin, particularly ethylene, is preferred.

These other monomers that are copolymerizable with norbornene monomers can be used individually or in combination of two or more species. When norbornene monomers and other monomers that are copolymerizable therewith are subjected to addition copolymerization, the ratio by weight of a structural unit derived from norbornene monomer in the addition copolymer to a structural unit derived from other copolymerizable monomer in the addition copolymer is appropriately selected to be usually in the range of 30:70 to 99:1, preferably 50:50 to 97:3, and more preferably 70:30 to 95:5.

(2) Monocyclic Cycloolefinic Polymer

As the monocyclic cycloolefinic polymer, for example, addition polymers of monocyclic cycloolefinic monomers such as cyclohexene, cycloheptene or cyclooctene can be used.

The molecular weight of the norbornene polymer or monocyclic cycloolefinic polymer that is preferably used for the bonding method of the present invention is appropriately selected in accordance with the purpose of use, and when the weight average molecular weight of the polymer in terms of polyisoprene or polystyrene, measured by gel permeation chromatography using a cyclohexane solution (if the polymer resin is not soluble, a toluene solution), is in the range of usually 5,000 to 1,000,000, preferably 8,000 to 800,000, and more preferably 10,000 to 500,000, the molded product is highly balanced between mechanical strength and molding processability, which is suitable.

The glass transition temperature (Tg) of the cycloolefin (co)polymer resin used for the bonding method of the present invention may be appropriately selected according to the purpose of use, but is in the range of usually 80° C. or greater, preferably 100° C. to 250° C., and more preferably 120° C. to 200° C. Within this range, the resin is highly balanced between heat resistance and molding processability, which is suitable.

According to the bonding method of the present invention, the above-described cycloolefin (co)polymer may be used individually or in combination of two or more species.

A 4-methyl-1-pentene (co)polymer is a (co)polymer obtained by using 4-methyl-1-pentene as at least a part of the (co)polymerizing component. The 4-methyl-1-pentene (co)polymer has excellent properties such as excellent flexibility, transparency or heat resistance, but may be not necessarily satisfactory in the aspect of gas barrier property, thus it being desired to be bonded with other resins by lamination or the like for use. However, adhesion of the 4-methyl-1-pentene (co)polymer is not necessarily easy, and an excellent bonding method is required. Accordingly, when the 4-methyl-1-pentene (co)polymer is used for the member (a), particularly the layer (a1), according to the present invention, the effect of the bonding method of the present invention can be particularly significantly utilized.

The 4-methyl-1-pentene (co)polymer that is preferably used according to the bonding method of the present invention includes a 4-methyl-1-pentene homopolymer or a copolymer of 4-methyl-1-pentene with other α-olefin. In the case of using a copolymer, examples of the other α-olefin as the copolymerizing component include α-olefins having 2 to 20 carbon atoms such as ethylene, propylene, 1-butene, 1-hexene, 1-octene, 1-decene, 1-dodecene, 1-tetradecene, 1-hexadecene, 1-octadecene and 1-eicosene. Preferred copolymerizable components are 1-dodecene, 1-tetradecene, 1-hexadecene, 1-octadecene or 1-eicosene. As the copolymer, a tertiary or higher copolymer obtained by copolymerizing two or more of the above-described α-olefins in combination may be also used. In particular, a copolymer based mainly on 4-methyl-1-pentene, which contains 80% or more of 4-methyl-1-pentene by weight, is preferably used. When the content of the copolymerizing component (other α-olefin) exceeds 20% by weight, the melting point of the 4-methyl-1-pentene (co)polymer is lowered, and the heat resistance tends to decrease. Thus, from the viewpoint of relation with the purpose of the present invention, it is preferable that the content of the copolymerizing component is appropriately adjusted.

According to the bonding method of the present invention, the 4-methyl-1-pentene (co)polymer that can be used for the member (a) preferably has a melt flow rate (MFR) in the range of 5 to 50 g/10 min, as measured under a load of 5.0 kg and at a temperature of 260° C. according to ASTM D1238. In particular, the melt flow rate is preferably in the range of 7 to 30 g/10 min. A 4-methyl-1-pentene (co)polymer having the MFR in the above-described range can be easily molded into films, and thus is preferable.

For the member (a), particularly the layer (a1), used for the bonding method of the present invention, 4-methyl-1-pentene (co)polymer may be used individually or in combination of two or more species. It is also possible to combine 4-methyl-1-pentene (co)polymers with other polyolefins and use them in the form of blend or the like.

Various additives can be added to the member (a) and/or layer (a1) that are used for the bonding method of the present invention, within the scope of not impairing the effect of the present invention. For example, when the member (a) and/or layer (a1) are mainly composed of organic polymer resins, one or two or more additives selected from other resins, and/or plasticizer, releasing agent, thickening agent, antioxidant, ultraviolet absorbent, stabilizer, filler (in particular, metallic material filler comprising gold, copper, tungsten or the like to impart electric conductivity, or inorganic material filler comprising glass, ceramics, single crystal or the like to impart mechanical strength), pigments, dyes, antistatic agent, antibacterial agent, antifungal agent, flame retardant, dispersant and the like can be added.

(Inorganic Compound (C) Having Nitrogen and Hydrogen Atoms)

The member (a) according to the bonding method of the present invention has a layer comprising an inorganic compound (C) having nitrogen and hydrogen atoms on the outermost surface. The inorganic compound (C) having nitrogen and hydrogen atoms used for the bonding method of the present invention should be a metal and/or non-metal compound and have at least nitrogen and hydrogen atoms, and may contain oxygen, carbon, halogen atoms and the like in addition to the nitrogen and hydrogen atoms.

In particular, from the viewpoint of further enhancing the adhesiveness to the adhesive resin, the inorganic compound (C) has nitrogen and hydrogen atoms, and it is preferable that the nitrogen and hydrogen atoms exist in a bound state.

The amount of hydrogen in the inorganic compound (C) is preferably 1 to 40% by atom, and more preferably 1 to 30% by atom.

There is no particular limitation on the type of metal and non-metal elements of the metal and/or non-metal compound, but from the viewpoint of the feasibility of production, nitrides and oxynitrides of silicon, aluminum and titanium are preferred, and when transparency is required, nitrides and oxynitrides of silicon are particularly preferred.

A particularly optimal compound is silicon nitride or silicon oxynitride, but in this case, the ratio of the numbers of nitrogen atoms to the silicon atoms is preferably $0.01 <$ No. of nitrogen atoms/No. of silicon atoms $\leq 2$, and more preferably $0.05 <$ No. of nitrogen atoms/No. of silicon atoms $\leq 1.4$, from the viewpoint of adhesiveness.

In the case of containing oxygen atoms, it is preferable, on consideration of the transparency or the like, that the number of oxygen atoms is appropriately selected on the basis that the number of nitrogen atoms and the number of silicon atoms are in the above-described ranges.

The film thickness of the layer comprising the inorganic compound (C) having nitrogen and hydrogen atoms should be a thickness capable of uniformly coating the underlayer from the viewpoint of adhesiveness. The film thickness is in general appropriately selected to be 0.2 nm to 1 µm depending on the underlayer, but when used for optical applications or the like, it is desirable that a film thickness giving an appropriate value of light transmissivity or reflectivity in a desired wavelength region is appropriately selected.

When transparency is required, as in the case of being used for the display parts of display elements or the like, the light absorption rate for the visible light region of the layer comprising the inorganic compound (C) having nitrogen and hydrogen atoms is preferably 10% or less, and more preferably 5% or less.

According to the bonding method of the present invention, the layer comprising the inorganic compound (C) having nitrogen and hydrogen atoms can be formed by known film forming methods. Specifically, mention may be made of methods for film forming by deposition, sputtering or CVD, and appropriate methods and materials for film formation are selected depending on the metal or non-metal material, or on the nitrification or hydrogenation method.

In particular, when a silicon nitride film is to be formed, in the case of sputtering, it is possible to form a film by means of, for example, discharge of a gas mixture of argon and nitrogen using a silicon target, or discharge of argon using a silicon nitride target, while in the case of incorporating hydrogen, it is possible to form a desired film by mixing hydrogen or ammonia into the discharge gases. In the case of film forming by the CVD method, a plasma CVD method, a catalyst CVD method or the like is used, and it is possible to form a silicon nitride film containing hydrogen by using, for example, a silane compound such as silane, disilane, trimethylsilane or hexamethyldisilazane, and nitrogen or ammonia. In order to enhance compactness of the film or to improve the optical properties, more hydrogen may be mixed into the gas for film formation.

Further, when a silicon oxynitride film is to be formed, in the case of sputtering, it is possible to form a film by means of, for example, discharge of a gas mixture of argon, nitrogen and oxygen using a silicon target, or discharge of a gas mixture of argon and oxygen using a silicon nitride target, while in the case of incorporating hydrogen, it is possible to form a desired film by mixing hydrogen or ammonia into the discharge gases. In the case of film forming by the CVD method, a plasma CVD method, a catalyst CVD method or the like is used, and it is possible to form a silicon oxynitride film containing hydrogen by using, for example, a silane compound such as silane, disilane, trimethylsilane, hexamethyldisilazane or tetraethoxysilane, and nitrogen or ammonia, and steam. In order to enhance compactness of the film or to improve the optical properties, more hydrogen may be appropriately mixed into the gas for film formation.

In order to improve the adhesiveness of these outermost surface layer and the underlayer, the surface underlayer may be subjected to plasma treatment using argon, oxygen, hydrogen, nitrogen, ammonia or the like, or to radical treatment using hydrogen, ammonia or the like, prior to the film formation as described above, and rather, such treatments are suitably used.

The layer constitution of the member (a) according to the bonding method of the present invention is not particularly limited otherwise, as long as a layer comprising an inorganic compound (C) having nitrogen and hydrogen atoms is present on the outermost surface of the member (a). That is, the layer comprising the inorganic compound (C) having nitrogen and hydrogen atoms may be directly laminated on the substrate of the member (a), or may be laminated on one or two or more intermediate layers. In particular, a multilayer film of organic layer/inorganic layer for improving the gas barrier performance, or a multilayer film of low refractive index layer/high refractive index layer for improving optical properties such as prevention of reflection, can be rather suitably used as an intermediate layer between the substrate layer and the layer comprising the inorganic compound (C) having nitrogen and hydrogen atoms which is located on the outermost surface.

((Member (b)))

According to the bonding method of the present invention, member (b) contains a compound having at least one functional group selected from the group consisting of an isocyanate group, a carboxyl group and a cyclic ether group. Among these, a member (b) containing a compound having at least an epoxy group is preferred. Preferred examples of the compound containing an epoxy group include monofunctional epoxy compounds such as phenylglycidyl ether, 2-ethylhexylglycidyl ether, ethyldiethylene glycol glycidyl ether, dicyclopentadiene glycidyl ether and 2-hydroxyethylglycidyl ether; bifunctional epoxy compounds such as hydroquinone diglycidyl ether, resorcin diglycidyl ether, ethylene glycol diglycidyl ether, polyethylene glycol diglycidyl ether, 1,4-butanediol diglycidyl ether, 1,6-hexanediol diglycidyl ether, cyclohexanediol diglycidyl ether, cyclohexanedimethanol diglycidyl ether, dicyclopentadienediol diglycidyl ether, 1,6-naphthalenediol diglycidyl ether, bisphenol A diglycidyl ether, bisphenol F diglycidyl ether, hydrogenated bisphenol A diglycidyl ether, hydrogenated bisphenol F diglycidyl ether, hexahydrophthalic acid glycidyl ester and dimer acid glycidyl ester; polyfunctional epoxy compounds such as trimethylolpropane triglycidyl ether, pentaerythritol tetraglycidyl ether, phenol novolac type epoxies, cresol novolac type epoxies, tetraglycidylaminodiphenylmethane, 3,4-epoxy-6-methylcyclohexylmethyl carboxylate, triglycidyl isocyanurate, 3,4-epoxycyclohexylmethyl carboxylate, polypropylene diglycidyl ether, and polybutadiene or polysulfide modified with diglycidyl ether at both terminals; and polymers obtained by using these, but are not limited to these.

It is possible to use compounds containing at least one alicyclic epoxy group in the molecule.

Specifically, mention may be made of compounds represented by the following formulas (I) to (IV) and polymers obtained by using these, without being limited to these.

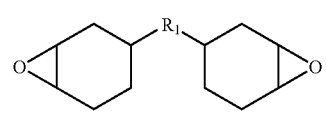

Formula I

In formula I, $R_1$ is an oxygen atom, a sulfur atom; a linear or branched alkylene group having 1 to 20 carbon atoms such as a methylene group, an ethylene group, a propylene group or a butylene group; a linear or branched poly(alkyleneoxy) group having 1 to 120 carbon atoms such as a poly(ethyleneoxy) group or a poly(propyleneoxy) group; a linear or branched unsaturated hydrocarbon group such as a propenylene group, a methylpropenylene group or a butenylene group; a carbonyl group; an alkylene group containing a carbonyl group; or an alkylene group containing a carbamoyl group in the middle of the molecular chain.

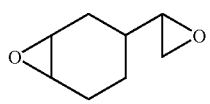

Formula II

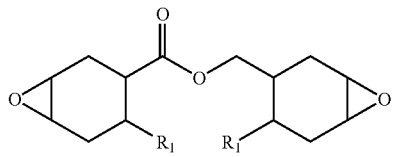

Formula III

In formula III, $R_1$ are each a hydrogen atom, a fluorine atom; an alkyl group having 1 to 6 carbon atoms such as a methyl group, an ethyl group, a propyl group, a butyl group, a pentyl group or a hexyl group; a fluoroalkyl group having 1 to 6 carbon atoms such as a trifluoromethyl group, a perfluoromethyl group, a perfluoroethyl group or a perfluoropropyl group; an aryl group having 6 to 18 carbon atoms such as a phenyl group or a naphthyl group; a furyl group or a thienyl group. $R_1$ may be identical to or different from each other.

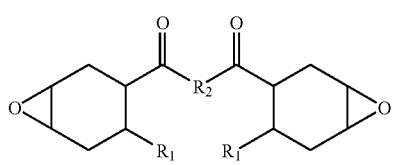

Formula IV

In formula IV, $R_1$ are each a hydrogen atom, a fluorine atom; an alkyl group having 1 to 6 carbon atoms such as a methyl group, an ethyl group, a propyl group, a butyl group, a pentyl group or a hexyl group; a fluoroalkyl group having 1 to 6 carbon atoms such as a trifluoromethyl group, a perfluoromethyl group, a perfluoroethyl group or a perfluoropropyl group; an aryl group having 6 to 18 carbon atoms such as a phenyl group or a naphthyl group; a furyl group or a thienyl group. $R_1$ may be identical to or different from each other. $R_2$ is an oxygen atom, a sulfur atom; a linear or branched alkylene group having 1 to 20 carbon atoms such as a methylene group, an ethylene group, a propylene group or a butylene group; a linear or branched poly(alkyleneoxy) group having 1 to 120 carbon atoms such as a poly(ethyleneoxy) group or a poly(propyleneoxy) group; a linear or branched unsaturated hydrocarbon group such as a propenylene group, a methylpropenylene group or a butenylene group; a carbonyl group; an alkylene group containing a carbonyl group; or an alkylene group containing a carbamoyl group in the middle of the molecular chain. It is also possible to use compounds resulting from fluoro-substitution of part or all of the hydrogen atoms in carbon-hydrogen bonds of the compounds of formulas (I) to (IV), and polymers obtained by using these. More specifically, preferred examples thereof include compounds resulting from fluoro-substitution of 6 hydrogen atoms belonging to the methyl group of bisphenol A glycidyl ether (bisphenol AF diglycidyl ether), reaction products of compounds resulting from fluoro-substitution of 6 hydrogen atoms belonging to the methyl group of bisphenol A and epoxy compounds, and the like.

According to the bonding method of the present invention, the method of curing the member (b) is not limited, but mention may be made of a method of curing the above-described epoxy resins by using, for example, an acid anhydride curing agent. Specific examples include acid anhydride curing agents such as phthalic anhydride, tetrahydrophthalic anhydride, hexahydrophthalic anhydride, methyltetrahydrophthalic anhydride, methylhexahydrophthalic anhydride and methylnadic anhydride.

In general, a curing system using acid anhydride curing agents can have enhanced curability when used in combination with a curing accelerator. Specifically, a tertiary amine compound such as benzyldimethylamine or 2,4,6-tris(dimethylaminomethyl)phenol, an imidazole compound such as 2-methylimidazole, 2-ethyl-4-methylimidazole or 1-benzyl-2-methylimidazole, or the like can be used, and in addition to those, Lewis base compounds can be preferably used as the curing accelerator.

According to the bonding method of the present invention, a coupling agent can be added to the member (b) in order to enhance the interfacial adherence to the member (a). As the coupling agent, it is possible to use compounds represented by, for example, the following formula (V) and formula (VI):

$$(R_2O)_3\text{—Si—}R_3R_4 \quad \text{Formula V}$$

$$(R_2O)_3\text{—Ti—}R_3R_4 \quad \text{Formula VI}$$

in formula (V) and formula (VI), $R_2$ is an alkyl group such as a methyl group, an ethyl group or a propyl group. $R_3$ is a linear or branched alkylene group having 1 to 20 carbon atoms such as a methylene group; an ethylene group, a propylene group or a butylenes group; a linear or branched poly(alkyleneoxy) group having 1 to 120 carbon atoms such as a poly(ethyleneoxy) group or a poly(propyleneoxy) group; a linear or branched unsaturated hydrocarbon group such as a propenylene group, a methylpropenylene group or a butenylene group; a carbonyl group; an alkylene group containing a carbonyl group; an alkylene group containing a carbamoyl group in the middle of the molecular chain; or a phenyl group. $R_4$ is an alkyl group such as a methyl group, an ethyl group or a propyl group, a glycidyl ether group, a primary amine, a thiol group, a vinyl group or an isocyanate group. It is also possible to use materials resulting from fluoro-substitution of part or all of hydrogen atoms of carbon-hydrogen bonds of these coupling agents. Preferably, materials resulting from fluorine substitution of hydrogen of methylene group or methyl group are used.

According to the bonding method of the present invention, a microparticulate filler, preferably a microparticulate inorganic filler, can be added to the member (b). Microparticulate inorganic filler refers to an inorganic filler having an average diameter of the primary particle in the range of 0.005 to 10 μm. Specifically, mention may be made of silica, talc, alumina, mica, calcium carbonate and the like. Microparticulate inorganic filler that can be used includes both non-surface treated ones and surface treated ones. Examples of the surface treated microparticulate inorganic filler include methoxylated, trimethylsilylated or octylsilylated microparticulate inorganic fillers, microparticulate inorganic filler surface treated with silicone oil, and the like. These components can be used individually or in combination of two or more species.

According to the bonding method of the present invention, additives in addition to those, such as leveling agent or surfactant, can be appropriately used with the member (b).

As described above, it is most preferable that the member (b) contains a compound having an epoxy group, but it is also preferable that the member (b) contains a compound having at least one group selected from the group consisting of an isocyanate group, a carboxyl group and a cyclic ether group (other than an epoxy group).

Specific examples of the compound having an isocyanate group include urethane polymers, isocyanate prepolymers, their blocked isocyanate compounds, and polymers of higher degree of polymerization obtained by using these, but are not limited to these. Here, the isocyanate prepolymer may be exemplified by an isocyanurate product, biuret product or adduct product derived from a diisocyanate compound. Examples of the diisocyanate compound include aromatic compounds such as tolylenediisocyanate, xylylenediisocyanate and diphenylmethanediisocyanate; aliphatic compounds such as tetramethylenediisocyanate, hexamethylenediisocyanate and trimethylhexamethylenediisocyanate; and alicyclic compounds such as isophorondiisocyanate, methylcyclohexane-2,4-diisocyanate, methylcyclohexane-2,6-diisocyanate, 4,4-methylenebis(cyclohexylisocyanate) and 1,3-di(isocyanatomethyl)cyclohexane, but are not limited to these. Further, resins obtained by polymerizing the above-described compounds and compounds having hydroxyl groups or compounds having amino groups, with isocyanate groups being interposed between the compounds, and also the compounds being polymerized to have residual isocyanate groups, can be also used for the member (b) of the present invention.

The blocked isocyanate compound is a product obtained by blocking the isocyanate group of an isocyanate prepolymer with a blocking agent. Examples of the blocking agent include those based on phenol, lactam, oxime, imine, active methylene, acid amide, imide, sulfite and the like, and preferably blocking agents based on phenol, lactam, oxime and imine. Specific examples thereof include phenol-based blocking agents such as phenol, cresol, xylenol, nitrophenol, chlorophenol, ethylphenol, p-hydroxydiphenyl, t-butylphenol, o-isopropylphenol, o-sec-butylphenol, p-nonylphenol, p-t-octylphenol, hydroxybenzoic acid and hydroxybenzoic acid ester; lactam-based blocking agents such as ε-caprolactam, δ-valerolactam, γ-butyrolactam and β-propiolactam; oxime-based blocking agents such as formamidoxime, acetaldoxime, acetoxime, methyl ethyl ketoxime, diacetylmonooxime, benzophenonoxime and cyclohexanonoxime; and imine-based blocking agents such as ethyleneimine and propyleneimine, but are not limited to these.

Specific examples of the compounds having carboxyl group include acrylic resins obtained by copolymerizing radical polymerizable monomers such as (meth)acrylic acid, modification products obtained by modifying polyethylene or polypropylene with maleic anhydride, maleic anhydride styrene copolymer, polyester resins having acid value and the like, but are not limited to these.

As the compound having a cyclic ether group other than an epoxy group, those capable of addition to amino groups or cationic polymerizable ones are preferred. Preferred specific examples thereof include compounds having an oxetane ring, which is a cyclic ether group formed from a 4-membered ring, and polymers obtained therefrom. Specific examples of the compound having one oxetane ring include 3-ethyl-3-hydroxymethyloxetane, 3-(meth)allyloxymethyl-3-ethyloxetane, (3-ethyl-3-oxetanylmethoxy)methylbenzene, 2-ethylhexyl(3-ethyl-3-oxetanylmethyl)ether, ethyldiethylene glycol(3-ethyl-3-oxetanylmethyl)ether, 3-cyclohexylmethyl-3-ethyloxetane and the like, but are not limited to these.

Specific examples of the compound having two oxetane rings include 1,4-bis{[(3-ethyl-3-oxetanyl)methoxy]methyl}benzene, bis{[(1-ethyl)-3-oxetanyl]methyl}ether, 1,4-bis[(3-ethyl-3-oxetanyl)methoxy]benzene, 1,3-bis[(3-ethyl-3-oxetanyl)methoxy]benzene, 3,7-bis(3-oxetanyl)-5-oxanonane, 1,4-bis[(3-ethyl-3-oxetanylmethoxy)methyl]benzene, 1,2-bis[(3-ethyl-3-oxetanylmethoxy)methyl]ethane, 1,2-bis[(3-ethyl-3-oxetanylmethoxy)methyl]propane, ethylene glycolbis(3-ethyl-3-oxetanylmethyl)ether, dicyclopentenylbis(3-ethyl-3-oxetanylmethyl)ether and the like, but are not limited to these.

Specific examples of the compound having three or more oxetane rings include trimethylolpropanetris(3-ethyl-3-oxetanylmethyl)ether, pentaerythritoltris(3-ethyl-3-oxetanylmethyl)ether, pentaerythritoltetrakis(3-ethyl-3-oxetanylmethyl)ether, dipentaerythritolpentakis(3-ethyl-3-oxetanylmethyl)ether and the like, but are not limited to these. Compounds having a 5-membered furan ring and polymers obtained therefrom are also preferably used. Specific examples of the compound having a furan ring include tetrahydrofuran and dihydrofuran, but are not limited to these. These can be used through ionic polymerization such as anionic polymerization and cationic polymerization.

To describe the cationic polymerization in detail, the above-described cyclic ether can be subjected to cationic polymerization using a thermolatent or photolatent cationic polymerization initiator, and then can be used. These cyclic ethers may be employed individually or in combination of plural species. In addition, for example, when cationic polymerization is to be carried out, other cationically polymerizable monomers, for example, vinyl ethers and styrenes, can be also used in combination.

The shape and means of bonding for the member (a) and the member (b) to which the bonding method of the present invention is applicable are not particularly limited, and the bonding method can be effectively applied to all bondable members of any shape. A particularly important point in practice is the case where both the member (a) and member (b) are in film forms, and they are laminated to produce a composite film. A composite film is practically important since the advantages of multiple members can be effectively combined and used. When the member (a) is a molded product, while the member (b) is a coating material, a firm coating can be provided to the molded product without the need for a primer, and functions such as designability and hardness can be certainly imparted.

The bonding method of the present invention is also used for the production of optical parts such as lenses, high-reflection films, low-reflection films, protective films, retardation plates, polarizing plates, waveguidesand diffusion plates. According to the present invention, stable adhesion can be realized, while maintaining transparency of the bonding interfaces, by appropriately selecting the types of the adhesive resin and the inorganic compound having nitrogen and hydrogen atoms. In this case, the bonding method of the present invention is particularly preferable in the production of the above-described various optical parts.

The bonding method of the present invention is particularly preferably used in the production of electronic or electric parts such as CCD elements and photo-pickups. A CCD parts is such that a CCD element is installed inside the package, and the light collector part is covered by a glass lid by means of an adhesive to maintain the environmental durability of the element against moisture or the like. Here, weight reduction can be expected if a transparent plastic material comprising COC, an excellent moisture permeation barrier, or the like instead of conventional glass is used; however, since COC itself is hardly adhesive, realization of weight reduction by the above means has been difficult. But, when the bonding method of the present invention is used, weight reduction is made possible, and thus both weight reduction and sufficient moisture permeation barrier property can be realized for electronic or electric parts.

The bonding method of the present invention is also particularly preferably used for the production of other electronic or electric parts, for example, various display elements such as liquid crystal display elements, plasma displays and organic EL elements, particularly flat panel type display elements, especially organic EL elements. These display elements advantageously employ various optical parts produced by the bonding method of the present invention. In addition, the bonding method of the present invention is advantageously used when sealing of the display elements is carried out using a sealant film. Furthermore, the bonding method can be also used in other electronic parts, for example, electronic paper.

These optical parts and/or electronic or electric parts can be used for a wide range of applications including various apparatuses such as electronic or electric instruments and transport machines.

<Composite Film>

Next, a composite film that is suitable for the sealing method employing the above-described bonding method, will be explained with reference to a sealant film and a transparent conductive film as examples.

((Sealant film))

A first embodiment of the composite film of the present invention is a composite film comprising a laminate having a layer (a1) comprising an organic polymer (A) and a layer (c1) comprising an inorganic compound (C) having nitrogen and hydrogen atoms, wherein at least one of the outermost surfaces is formed with the layer (c1) comprising the inorganic compound (C) having nitrogen and hydrogen atoms. According to the first embodiment of the composite film of the present invention, it is desirable that the light transmissivity of the composite film at a wavelength of 550 nm is 50% or greater, preferably 70% or greater, and more preferably 80% or greater. According to the first embodiment of the composite film of the present invention, it is desirable that the steam permeability of the composite film is 10 $g/m^2/day$ or less, preferably 1 $g/m^2/day$ or less, and more preferably 0.1 $g/m^2/day$ or less.

As an example of such composite film, mention may be made of a sealant film having an identical constitution (hereinafter, may be referred to as a first sealant film). Hereinafter, the case where the composite film of the present invention is the first sealant film will be specifically described.

(Layer (a1) Comprising Organic Polymer (A))

With regard to the layer (a1) comprising an organic polymer (A) in the composite film of the present invention, for example, the first sealant film, the thickness thereof is not particularly limited, as long as the layer (a1) is in a film form, but on consideration of the self-sustenance, handlability, impact resistance or the like, the thickness is usually 2 μm to 400 μm, preferably 20 to 200 μm. The organic polymer material to form this is appropriately selected according to the purpose of use, in view of properties such as heat resistance, transparency, birefringence, thermal contractility, gas barrier property, mechanical strength and the like, and specific examples of the organic polymer material include films comprising polyethylene, polypropylene, polystyrene, cyclic polyolefin, polyethylene terephthalate, polysulfone, polyethersulfone, polyester, polymethyl methacrylate, polycarbonate, polyallylate, polyacetate, polyamide, poly-4-methyl-pentene-1, cellulose, polyvinyl chloride, polyacrylonitrile resins, phenoxy resins, or polyphenylene oxide resins, or the like.

Among various resins described above, polyolefin and polyethylene terephthalate that are balanced in the mechanical properties, optical properties, costs and the like, are particularly preferably used. The polyolefin that is preferably used for the first sealant film of the present invention is not particularly limited, but a polyolefin obtained by using at least one monomer selected from ethylene, propylene, 1-butene, 4-methyl-1-pentene and a cycloolefin (olefin having a cyclic structure) as the (co)polymerizing component, is particularly preferably used from the aspect of being particularly well balanced in the mechanical properties, optical properties, costs and the like.

A cycloolefin (co)polymer obtained by (co)polymerizing at least one cycloolefin having particularly high steam barrier property as well as high transparency, low birefringence and low water absorbability, can be suitably used particularly for the display parts of display elements.

Here, a cycloolefin (co)polymer is a polymer obtained by using a cycloolefin (olefin having a cyclic structure) as at least a part of the (co)polymerizing component. Specific examples of the cycloolefin (co)polymer resin include norbornene polymers, monocyclic cycloolefinic polymers, hydrogenation products thereof, and the like. Among these, norbornene polymers and hydrogenation products thereof are preferred from the viewpoint of dimensional stability, heat resistance, mechanical strength and the like.

The cycloolefin (co)polymers that are preferably used for the first sealant film of the present invention are the same as the cycloolefin (co)polymers described in relation to the substrate of the member (a) according to the above-described bonding method of the present invention.

The layer (a1) comprising organic polymer (A) that is used for the first sealant film of the present invention can be added various additives, within the scope of not impairing the purpose of the present invention. For example, one or two or more additives selected from other resins and/or plasticizer, antioxidant, ultraviolet absorbent, stabilizer, filler, pigment, dye, antistatic agent, antibacterial agent, antifungal agent, flame retardant, dispersant and the like, can be added.

(Layer (c1) Comprising Inorganic Compound (C) having Nitrogen and Hydrogen Atoms)

The inorganic compound (C) having nitrogen and hydrogen atoms that is used for the first sealant film of the present invention is the same as the inorganic compound (C) having nitrogen and hydrogen atoms described in relation to the member (a) according to the above-described bonding method of the present invention. From the aspect of adhesiveness the larger of the amount of hydrogen in the inorganic compound (C) in this case, the more favorable, while from the aspect of gas barrier property, that is, the compactness of the inorganic compound, the smaller of the amount, the more favorable; therefore, the amount of hydrogen should be appropriately selected in consideration of the balance between the two sides. The preferred amount of hydrogen is preferably 1 to 40% by atom, and more preferably 1 to 30% by atom.

For the metal and/or non-metal compound as the inorganic compound (C), nitrides and oxynitrides of silicon, aluminum and titanium are preferred from the aspect of feasibility of production, while nitrides and oxynitrides of silicon are particularly preferred from the aspect of transparency or gas barrier property. In particular, the optimal compound is silicon nitride or silicon oxynitride, and in this case, the ratio of the number of nitrogen atoms to the number of silicon atoms is preferably $0.01 \leq$ No. of nitrogen atoms/No. of silicon atoms $\leq 2$, and more preferably $0.05 \leq$ No. of nitrogen atoms/No. of silicon atoms $\leq 1.4$, from the viewpoint of adhesiveness.

It is preferable, on consideration of the transparency and gas barrier property, that the number of oxygen atoms is appropriately selected on the basis that the number of nitrogen atoms and the number of silicon atoms are in the above-described ranges.

The film thickness of the layer (c1) comprising the inorganic compound (C) having nitrogen and hydrogen atoms is not particularly limited, as long as the layer (c1) is capable of uniformly coating the underlayer from the viewpoint of adhesiveness. The film thickness is in general appropriately selected to be 0.2 nm to 1 µm depending on the underlayer, but when the aspects of gas barrier performance and flex resistance in relation to the gas barrier performance are taken into account, the thickness is preferably 2 to 500 nm, and more preferably 10 to 200 nm.

When transparency is required for the sealant film, as in the case of being used for the display parts of display elements and the like, the light absorption rate for the visible light region of the layer (c1) comprising the inorganic compound (C) having nitrogen and hydrogen atoms is preferably 10% or less, and more preferably 5% or less.

The layer (c1) comprising the inorganic compound (C) having nitrogen and hydrogen atoms according to the first sealant film of the present invention can be formed by a known film forming method. The specific methods and conditions for film formation are the same as those for the above-described layer comprising the inorganic compound (C) having nitrogen and hydrogen atoms according to the bonding method of the present invention.

The constitution of the first sealant film of the present invention is not particularly limited otherwise, as long as a layer (a1) comprising an organic polymer (A), which functions as the substrate, and a layer (c1) comprising an inorganic compound (C) having nitrogen and hydrogen atoms on the outermost surface of the layer (a1), are present. That is, the layer (c1) comprising the inorganic compound (C) having nitrogen and hydrogen atoms may be directly laminated on the layer (a1) comprising organic polymer (A), or may be laminated on one or two or more intermediate layers. In particular, a multilayer of organic layer/inorganic layer for improving the gas barrier performance, or a multilayer of low refractive index layer/high refractive index layer for improving optical properties such as prevention of reflection, can be rather suitably used as an intermediate layer between the layer (a1) comprising organic polymer (A) and the layer (c1) comprising the inorganic compound (C) having nitrogen and hydrogen atoms which is located on the outermost surface.

The first sealant film of the present invention should have at least one layer (a1) comprising organic polymer (A). From the viewpoint of simplifying the constitution and reducing the optical loss at the interface, the layer (a1) comprising organic polymer (A) preferably exists as one layer, but may also exist as two or more layers.

The first sealant film of the present invention should have at least one layer (c1) comprising the inorganic compound (C) having nitrogen and hydrogen atoms. From the viewpoint of simplifying the constitution, reducing the optical loss at the interface, and reducing the production costs, the layer (c1) comprising the inorganic compound (C) having nitrogen and hydrogen atoms preferably exists as one layer, but from the viewpoint of imparting adhesiveness to both surfaces or imparting enhanced gas barrier property, the layer preferably exists as two or more layers.

The first sealant film of the present invention may be, if necessary, covered on the entirety of both outermost surfaces of the film with the layer (c1) comprising the inorganic compound (C) having nitrogen and hydrogen atoms, may be covered on the entirety of only one outermost surface of the film with the layer (c1) comprising the inorganic compound (C) having nitrogen and hydrogen atoms, may be covered only on parts of both outermost surfaces of the film with the layer (c1) comprising the inorganic compound (C) having nitrogen and hydrogen atoms, or may be covered only on part of one surface of the film with the layer (c1) comprising the inorganic compound (C) having nitrogen and hydrogen atoms. The first sealant film of the present invention may also have the layer (c1) comprising the inorganic compound (C) having nitrogen and hydrogen atoms at some parts other than the outermost surfaces.

The first sealant film of the present invention has the layer (c1) comprising the inorganic compound (C) having nitrogen and hydrogen atoms on at least one of the outermost surfaces. The layer (c1) comprising the inorganic compound (C) has good adhesiveness to adhesive resins. Therefore, the sealing method of bonding the first sealant film of the present invention to an adhesive resin through the layer (c1) comprising the inorganic compound (C) having nitrogen and hydrogen atoms, is desirable in view of strong adhesive power or the like.

According to this sealing method, the layer (c1) comprising the inorganic compound (C) having nitrogen and hydrogen atoms of the sealant film is bonded to the adhesive resin.

(Adhesive Resin)

The adhesive resin which is favorably used in combination with the first sealant film of the present invention is not particularly limited, and any resin capable of mutual bonding of two or more members can be appropriately used. But, preferably used adhesive resins include those containing compounds having at least one group selected from the group consisting of a cyclic ether group such as an epoxy group, an isocyanate group and a carboxyl group. Among these, in view of adhesiveness, transparency and gas barrier property, adhesive resins containing at least one compound having an epoxy group are particularly preferably used. The compound as used herein is not particularly limited with respect to the degree of polymerization and molecular weight, and any of monomer, dimer, oligomer, prepolymer and polymer (with high degree of polymerization) may be used.

Preferred examples of the compound containing an epoxy group are the same as the above-described epoxy group-containing compounds of the member (b) of the bonding method of the present invention.

Compounds containing at least one alicyclic epoxy group in the molecule also can be used. Specifically, mention may be made of the same compounds containing at least one alicyclic epoxy group in the molecule for the member (b) of the above-described bonding method of the present invention, and of the compounds represented by the above-described formula (I) to (IV) and polymers obtained therefrom, but the examples are not limited to these.

The method of curing the adhesive resin which is preferably used in combination with the first sealant film of the present invention is not limited, and is the same as the above-described method of curing the member (b) of the bonding method of the present invention.

A coupling agent can be added to the adhesive resin which is preferably used for the first sealant film of the present invention in order to enhance the interface adherence to the layer (c1) comprising the inorganic compound (C) having nitrogen and hydrogen atoms. For the coupling agent, for example, the compounds represented by the formula (V) and formula (VI) described for the member (b) used in the bonding method of the present invention can be used.

Microparticulate filler, preferably microparticulate inorganic filler which is the same as the above-described microparticulate filler for the member (b) used in the bonding method of the present invention can be added to the adhesive resin which is preferably used in combination with the first sealant film of the present invention.

In addition to that, additives such as leveling agent or surfactant can be appropriately used for the adhesive resin which is preferably used in combination with the first sealant film of the present invention.

It is most preferable that the adhesive resin which is preferably used in combination with the first sealant film of the present invention contains a compound having an epoxy group, but it is also preferable that the adhesive resin contains a compound having at least one group selected from the group consisting of an isocyanate group, a carboxyl group and a cyclic ether group (other than the epoxy group).

Specific examples of the compound having an isocyanate group may be the same ones as the compounds having an isocyanate group described above for the member (b) of the bonding method of the present invention.

Specific examples of the compound having a carboxyl group may be the same ones as the compounds having a carboxyl group described above for the member (b) of the bonding method of the present invention.

As the compound having a cyclic ether group other than an epoxy group, mention may be made of the compounds having a cyclic ether group other than an epoxy group described above for the member (b) of the bonding method of the present invention.

For the adhesive resin which is preferably used in combination with the first sealant film of the present invention, the various compounds described above can be used individually or in combination of two or more species. When two or more species are used in combination, compounds of the same classes (for example, combination of compounds having an epoxy group) may be used in combination, or compounds of other classes (for example, combination of a compound having an epoxy group and a compound having an isocyanate group) may be used in combination.

The adhesive resin which is preferably used in combination with the first sealant film of the present invention can be added various additives such as other resins, plasticizer, antioxidant, ultraviolet absorbent and stabilizer, within the scope of not impairing the purpose of the present invention.

A second embodiment of the composite film of the present invention is a composite film formed with a laminate in which a layer (a1) comprising an organic polymer (A), a layer (c1) comprising an inorganic compound (C) having nitrogen and hydrogen atoms, and an adhesive resin layer (b1) are disposed in this order, wherein the layer (c1) comprising the inorganic compound (C) having nitrogen and hydrogen atoms and the adhesive resin layer (b1) are directly laminated. According to the second embodiment of the composite film of the present invention, it is desirable that the light transmissivity of the composite film at a wavelength of 550 nm is 50% or greater, preferably 70% or greater, and more preferably 80% or greater. According to the second embodiment of the composite film of the present invention, it is desirable that the steam permeability of the composite film is 10 $g/m^2/day$ or less, preferably 1 $g/m^2/day$ or less, and more preferably 0.1 $g/m^2/day$ or less.

As an example of such composite film, mention may be made of a sealant film having the same constitution (hereinafter, may be referred to as a second sealant film). Hereinafter, the case where the composite film of the present invention is the second sealant film will be specifically explained.

The composite film, for example, the second sealant film, of the present invention has a layer (a1) comprising an organic polymer (A) (usually a substrate layer) and an adhesive resin layer (b1) being integrated, and thus sealing can be carried out by adhering the adhesive resin layer (b1) with another member such as another film. In this case, the material or shape of the other member is not particularly limited, and any member having material or shape capable of adhesion to the adhesive resin layer (b1) can be favorably used.

The layer (a1) comprising organic polymer (A) according to the second sealant film of the present invention is similar to the layer (a1) comprising organic polymer (A) described above in detail in the explanation of the first sealant film of the present invention. Further, the layer (c1) comprising the inorganic compound (C) having nitrogen and hydrogen atoms according to the second sealant film of the present invention is similar to the layer (c1) comprising the inorganic compound (C) having nitrogen and hydrogen atoms described in detail in the explanation of the first sealant film of the present invention.

The adhesive resin layer (b1) according to the second sealant film of the present invention is a layer comprising an adhesive resin (B1) similar to the adhesive resin described in detail in the explanation of the preferred sealing method using the first sealant film of the present invention. The term "a layer comprising an adhesive resin (B1)" as used herein includes both the case where the entire layer is composed of the adhesive resin (B1), and the case where part of the layer is composed of the adhesive resin (B1). Accordingly, the adhesive resin layer (b1) can contain components other than the adhesive resin (B1), within the scope of not impairing the purpose of the present invention.

The second sealant film of the present invention has a layer (a1) comprising an organic polymer (A), a layer (c1) comprising an inorganic compound (C) having nitrogen and hydrogen atoms, and an adhesive resin layer (b1) disposed in this order. This does not imply that the layer (a1) comprising organic polymer (A) must be directly laminated on the layer (c1) comprising the inorganic compound (C) having nitrogen and hydrogen atoms. That is, the layer (c1) comprising the inorganic compound (C) having nitrogen and hydrogen atoms may be directly laminated on the layer (a1) comprising organic polymer (A), or may be laminated on one or two or more intermediate layers. In particular, a multilayer of organic layer/inorganic layer for improving the gas barrier performance, or a multilayer of low refractive index layer/high refractive index layer for improving optical properties such as prevention of reflection, can be rather suitably used as an intermediate layer between the layer (a1) comprising the organic polymer (A) and the layer (c1) comprising the inorganic compound (C) having nitrogen and hydrogen atoms which is located on the outermost surface.

The second sealant film of the present invention should have at least one layer (a1) comprising organic polymer (A). From the viewpoint of simplifying the constitution and reducing the optical loss at the interface, the layer (a1) comprising organic polymer (A) preferably exists as one layer, but may also exist as two or more layers.

The second sealant film of the present invention should have at least one layer (c1) comprising the inorganic compound (C) having nitrogen and hydrogen atoms. From the viewpoint of simplifying the constitution, reducing the optical loss at the interface, and reducing the production costs, the layer (c1) comprising the inorganic compound (C) having nitrogen and hydrogen atoms preferably exists as one layer, but from the viewpoint of imparting adhesiveness to both surfaces or imparting enhanced gas barrier property, the layer preferably exists as two or more layers. The second sealant film of the present invention may also have a layer (c1)

comprising the inorganic compound (C) having nitrogen and hydrogen atoms, in addition to the site being in contact with the adhesive resin.

The second sealant film of the present invention should have at least one adhesive resin layer (b1). From the viewpoint of simplifying the constitution, reducing the optical loss at the interface, and reducing the production costs, the adhesive resin layer (b1) preferably exists as one layer, but from the viewpoint of imparting adhesiveness to both surfaces and the like, the adhesive resin layer preferably exists as two or more layers.

Furthermore, according to the second sealant film of the present invention, the surface of the adhesive resin (B1) which is opposite to the layer (c1) comprising the inorganic compound (C) having nitrogen and hydrogen atoms may be protected by a releasing agent.

The following layer constitutions may be mentioned as particularly preferred layer constitution, but the second sealant film of the present invention is not limited to these:

<<1>> Layer (a1) comprising organic polymer (A)/layer (c1) comprising the organic compound (C) having nitrogen and hydrogen atoms/adhesive resin layer (b1);

<<2>> Layer (a1) comprising organic polymer (A)/intermediate layer/layer (c1) comprising the inorganic compound (C) having nitrogen and hydrogen atoms/adhesive resin layer (b1);

<<3>> Layer (a1) comprising organic polymer (A)/layer (c1) comprising the inorganic compound (C) having nitrogen and hydrogen atoms/adhesive resin layer (b1)/releasing agent layer;

<<4>> Layer (c1) comprising inorganic compound (C) having nitrogen and hydrogen atoms/layer (a1) comprising organic polymer (A)/layer (c1) comprising the inorganic compound (C) having nitrogen and hydrogen atoms/adhesive resin layer (b1); and <<5>> Adhesive resin layer (b1)/layer (c1) comprising inorganic compound (C) having nitrogen and hydrogen atoms/layer (a1) comprising organic polymer (A)/layer (c1) comprising the inorganic compound (C) having nitrogen and hydrogen atoms/adhesive resin layer (b1).

According to the second sealant film of the present invention, the layer (c1) comprising the inorganic compound (C) having nitrogen and hydrogen atoms and/or the adhesive resin layer (b1) can be arbitrarily present over the entirety of both surfaces of the substrate, over the entirety of only one surface of the substrate, over the entirety of one surface of the substrate and only on a part of the other surface of the substrate, only on parts of both surfaces of the substrate, or on any part of only one surface of the substrate.

The first and second sealant films of the present invention are expected to have high gas barrier property possessed by a laminate film of the layer (a1) comprising organic polymer (A) and the layer (c1) comprising the inorganic compound (C) having nitrogen and hydrogen atoms, and to have enhanced sealability due to the high adhesiveness of the layer (c1) comprising the inorganic compound (C) having nitrogen and hydrogen atoms and the adhesive resin. Therefore the first and second sealant films of the present invention are particularly favorably used for the production of electronic or electric parts such as mobile instruments or large screen displays, for which particularly light weight and small size (slimming) are simultaneously required.

In particular, according to the first and second sealant films of the present invention, in the case of combining a highly transparent layer comprising a organic polymer, a highly transparent layer comprising an inorganic compound having nitrogen and hydrogen atoms, and a highly transparent adhesive resin, the combination can be favorably used, owing to the high transparency, for various electronic or electric parts, for example, various display elements such as liquid crystal displays, plasma displays, field emission displays, surface conducting electron emitter element displays and organic EL elements. Above all the combination is particularly favorably used for the production of organic EL elements such as organic EL displays or organic EL lighting in particular. These sealant films can be also used as constitutional members of optical parts.

These optical parts and electronic or electric parts can be used in a wide range of applications including various apparatuses, such as electronic or electric instruments, and transport machines and the like.

<Transparent Conductive Film>

The third embodiment of the composite film of the present invention is a composite film formed with a laminate having a layer (a1) comprising an organic polymer (A), a layer (c1) comprising an inorganic compound (C) containing nitrogen and hydrogen atoms, and a transparent conductive layer (d1) disposed in this order, wherein part of one outermost surface or both outermost surfaces of the composite film is formed with the layer (c1) comprising the inorganic compound (C) containing nitrogen and hydrogen atoms. According to the third embodiment of the composite film of the present invention, it is desirable that the light transmissivity of the composite film at a wavelength of 550 nm is 50% or greater, preferably 70% or greater, and more preferably 80% or greater. Further, according to the third embodiment of the composite film of the present invention, it is desirable that the steam permeability of the composite film is 10 $g/m^2/day$ or less, preferably 1 $g/m^2/day$ or less, and more preferably 0.1 $g/m^2/day$ or less.

As an example of such composite film, a transparent conductive film having the same constitution may be mentioned. Hereinafter, the case where the composite film of the present invention is a transparent conductive film will be specifically described.

(Layer (a1) Comprising Organic Polymer (A))

The layer (a1) comprising organic polymer (A) according to the composite film, for example, the transparent conductive film of the present invention, is similar to the layer (a1) comprising organic polymer (A) described in detail in the explanation for the first sealant film of the present invention. The organic polymer material to be formed the layer (a1) comprising the organic polymer (A) can be exemplified by the organic polymer materials described in detail in the explanation for the first sealant film of the present invention, and further by films comprising polyimide, triacetylcellulose, liquid crystalline polymer and the like.

Among these, cycloolefin (co)polymers obtained by (co)polymerizing at least one cycloolefin, which have high steam barrier property, high transparency, low birefringence and low water absorbability, are particularly preferably used. The cycloolefin (co)polymer has high gas barrier property, and since the cycloolefin (co)polymers have insufficient adhesiveness to adhesive resins in many cases of the conventional art, the use of the cycloolefin (co)polymers for the substrates of transparent conductive films by means of the application of the present invention, has particularly high technical significance. Such transparent conductive films can be favorably used, in particular, for films constituting the display parts of display elements.

(Layer (c1) Comprising Inorganic Compound (C) having Nitrogen and Hydrogen Atoms)

Furthermore, the layer (c1) comprising the inorganic compound (C) having nitrogen and hydrogen atoms in the transparent conductive film of the present invention is similar to the layer (c1) comprising the inorganic compound (C) having nitrogen and hydrogen atoms described in detail in the explanation for the first sealant film of the present invention.

From the viewpoint of adhesiveness, the larger of the amount of hydrogen in the inorganic compound in this case, the more favorable, while a smaller amount of hydrogen is favorable when gas barrier property, etching resistance against the etching materials used for the patterning of the transparent conductive layer (d1), or solvent resistance for the protection of the underlayer, that is, compactness of the inorganic compound, is required. Thus, the amount of hydrogen should be appropriately selected in view of the both sides, but the amount is preferably 1 to 40% by atom, and more preferably 1 to 30% by atom.

Furthermore, for the metal and/or non-metal compound as the inorganic compound (C), nitrides and oxynitrides of silicon, aluminum and titanium are preferred from the viewpoint of feasibility of production, and nitrides and oxynitrides of silicon are particularly preferable from the viewpoints of transparency, gas barrier property and etching resistance against acid such as hydrochloric acid which is a wet etching material frequently used for the patterning of the transparent conductive layer (d1), and the like.

A particularly optimal compound is silicon nitride or silicon oxynitride, and in this case, the ratio of the number of nitrogen atoms to the number of silicon atoms is preferably $0.01 \leq$ No. of nitrogen atoms/No. of silicon atoms $\leq 2$, and more preferably $0.05 \leq$ No. of nitrogen atoms/No. of silicon atoms $\leq 1.4$, from the viewpoint of adhesiveness.

It is preferable, on consideration of transparency, gas barrier property, etching resistance or the like, that the number of oxygen atoms is appropriately selected on the basis that the number of nitrogen atoms and the number of silicon atoms are in the above-described ranges.

The film thickness of the layer (c1) comprising the inorganic compound (C) having nitrogen and hydrogen atoms is not particularly limited, as long as the layer (c1) is capable of uniformly coating the underlayer from the viewpoint of adhesiveness. The film thickness is in general appropriately selected to be 0.2 nm to 1 μm depending on the underlayer, but when the viewpoints of gas barrier performance, flex resistance to the gas barrier performance, and etching resistance or solvent resistance for the patterning of the transparent conductive layer should be taken into account, the thickness is preferably 2 to 500 nm, and more preferably 10 to 200 nm.

When high transparency is required for the transparent conductive film, as in the case of being used for the display parts of display elements or the like, the light absorption rate for the visible light region of the layer (c1) comprising the inorganic compound (C) having nitrogen and hydrogen atoms is preferably 10% or less, and more preferably 5% or less.

The layer (c1) comprising the inorganic compound (C) having nitrogen and hydrogen atoms according to the present invention can be formed by known methods for film formation. Specific method and conditions for film formation and the like are the same as in the case of the layer (c1) comprising the inorganic compound (C) having nitrogen and hydrogen atoms described above in detail in the explanation for the first sealant film of the present invention.

(Transparent Conductive Layer (d1))

For the transparent conductive layer used for the transparent conductive film of the present invention, mention may be made of thin films formed with (i) monolayers and laminates of metals such as gold, silver, copper, aluminum and palladium, and alloys thereof; (ii) monolayers and laminates of compound semiconductors such as tin oxide, indium oxide, indium oxide-tin oxide (ITO), zinc oxide and indium oxide-zinc oxide (IZO), and mixtures thereof; and (iii) laminates of (i) and (ii) above, and the like, that are conventionally known. In general, ITO is used from the aspect of transparency, environment resistance and the like. For the method of forming the transparent conductive layer (d1), known methods are used. For example, in the case of ITO used generally as the transparent conductive layer (d1), thin film layers can be formed by vacuum deposition, sputtering, ion plating or the like. In the case of forming by sputtering, indium-tin alloys and indium oxide-tin are used as the raw material in many cases. For example, in a method of producing an ITO thin film by sputtering, an ITO thin film is formed using a target comprising an indium-tin alloy or indium oxide-tin, while introducing argon and an oxygen generating material such as oxygen gas under reduced pressure. The thickness of the transparent conductive layer is usually 5 to 100 nm. The surface resistance value of the transparent conductive layer is usually 10 to 1000 Ω/SQ.

The layer constitution of the transparent conductive film according to an embodiment of the present invention is not particularly limited otherwise, as long as a layer (a1) comprising an organic polymer (A) for substrate, a transparent conductive layer (d1), and a layer (c1) comprising an inorganic compound (C) having nitrogen and hydrogen atoms that is disposed between the layer (a1) and the layer (d1), are present. That is, the layer (c1) comprising the inorganic compound (C) having nitrogen and hydrogen atoms may be directly laminated on the layer (a1) comprising inorganic polymer (A), or may be laminated on one or two or more intermediate layers. In particular, a multilayer of organic layer/inorganic layer for improving the gas barrier performance, or a multilayer of low refractive index layer/high refractive index layer for improving optical properties such as prevention of reflection, can be rather suitably used as an intermediate layer between the layer (a1) comprising the organic polymer (A) and the layer (c1) comprising the inorganic compound (C) having nitrogen and hydrogen atoms. Likewise, the transparent conductive layer (d1) also may be directly laminated on the layer (c1) comprising inorganic compound (C), or may be laminated on one or two or more intermediate layers.

The transparent conductive film according to an embodiment of the present invention should have at least one layer (a1) comprising organic polymer (A). From the viewpoint of simplifying the constitution and reducing the optical loss at the interface, the layer (a1) comprising organic polymer (A) preferably exists as one layer, but may also exist as two or more layers.

The transparent conductive film according to an embodiment of the present invention should have at least one layer (c1) comprising the inorganic compound (C) having nitrogen and hydrogen atoms. From the viewpoint of simplifying the constitution, reducing the optical loss at the interface, and reducing the production costs, the layer (c1) comprising the inorganic compound (C) having nitrogen and hydrogen atoms preferably exists as one layer, but in the case of imparting adhesiveness to both surfaces and the like, the layer preferably exists as two or more layers.

The transparent conductive film according to an embodiment of the present invention should have at least one transparent conductive layer (d1). From the viewpoint of simplifying the constitution, reducing the optical loss at the interface, and reducing the production costs, the transparent conductive layer (d1) preferably exists as one layer, but in the case of imparting transparent conductivity to both surfaces and the like, the layer preferably exists as two or more layers.

The transparent conductive layer (d1) which usually forms the outermost surfaces of the transparent conductive film according to an embodiment of the present invention does not cover part of one surface or both surfaces of the film.

There is no other limitation in particular, and if necessary, the transparent conductive layer may cover the entirety of one surface of the film, may cover the entirety of one surface and only a part of the other surface of the film, may cover only parts of both surfaces of the film, or may cover only a part of one surface of the film.

At least a part of the portion not covered by the transparent conductive layer (d1) exposes the layer (c1) comprising the inorganic compound (C) having nitrogen and hydrogen atoms. The layer (c1) comprising the inorganic compound (C) having nitrogen and hydrogen atoms have good adhesiveness to the adhesive resin. Therefore, at the part where the layer (c1) comprising the inorganic compound (C) containing nitrogen and hydrogen atoms forms the outermost surfaces, the method of direct bonding of the transparent conductive film of the present invention to the adhesive resin is preferable from the aspect of strong adhesive power and the like.

In this method of adhesion, the layer (c1) comprising the inorganic compound (C) having nitrogen and hydrogen atoms of the transparent conductive film is bonded to the adhesive resin.

(Adhesive Resin)

The adhesive resin that is favorably used in combination with the transparent conductive film of the present invention is not particularly limited, and any resin capable of bonding two or more members can be appropriately used. Specifically, the adhesive resin is the same as the adhesive resin described in detail in the explanation for the preferred sealing method using the first sealant film of the present invention.

The transparent conductive film of the present invention is particularly preferably used for the production of electronic and electric parts such as mobile instruments or large screen displays where particularly light weight and small size (slimming) are simultaneously required, due to the high adhesiveness of the layer (c1) comprising the inorganic compound (C) having nitrogen and hydrogen atoms and the adhesive resin.

In particular, in the case of combining a highly transparent layer (a1) comprising organic polymer (A), a highly transparent layer (c1) comprising inorganic compound (C) having nitrogen and hydrogen atoms, and a highly transparent conductive layer (d1), the transparent conductive film of the present invention can be favorably used, owing to the high transparency, for various electronic and electric parts, for example, various display elements such as liquid crystal displays, plasma displays, field emission displays, surface conducting electron emitter displays and organic EL elements, and is particularly favorably used for the production of electronic paper.

These electronic or electric parts can be used in a wide range of applications including various apparatuses such as electronic and electric instruments, and transport machines and the like.

EXAMPLES

Hereinafter, the present invention will be specifically illustrated with reference to Examples and Comparative Examples. The present invention is not limited in any way to these examples.

In the Examples and Comparative Examples below, the light absorption rate in the visible light region was measured by measuring the transmissivity and reflectivity with a near infrared-ultraviolet spectrophotometer (UV-3100PC available from Shimadzu Seisakusho, Ltd.). The gas barrier performance was determined by measuring the steam permeability at 40° C. and relative humidity of 100% by the Mocon method (using PERMATRAN-W600 available from Mocon, Inc.). The composition of the inorganic compound was measured by X-ray photoelectron spectroscopic analysis (hereinafter, may be referred to as XPS) (using ESCALAB 220iXL available from VG Scientific, Inc.). Furthermore, for the determination of hydrogen containment in the inorganic compound, a layer of the inorganic compound was formed on a silicon substrate to a thickness of 150 nm under the same production conditions as those for the formation of a layer of the inorganic compound on a film comprising an organic polymer, and the layer of the inorganic compound was measured using a Fourier transform infrared spectrometer (FT/IR-300 available from JASCO Corp.).

Example 1

An APEL (registered trademark) film (manufactured by Mitsui Chemicals Co., Ltd.) composed of a cycloolefin copolymer and having a thickness of 110 μm was used as a substrate. The substrate was placed on the support of a substrate at room temperature in a vacuum vessel. After vacuumizing the vessel until the degree of vacuum reached $1.3 \times 10^{-4}$ Pa, subsequently ammonia gas was introduced into the vacuum vessel in which the film was placed, and plasma of 150 W having a high frequency wave of 13.56 MHz was applied over the film to carry out surface treatment of the film for 30 seconds. Subsequently, silane gas, ammonia gas and hydrogen gas were introduced into the vacuum vessel in which the film was placed, and plasma of 150 W having a high frequency wave of 13.56 MHz to form a thin film of silicon nitride to a thickness of 50 nm. Thus, a member (a-1) was obtained.

FIG. 1 shows the constitution of the member (a-1), and a silicon nitride film 12 is laminated on a film substrate 11. In this constitution, the film was colorless and transparent.

An analysis of the surficial and internal compositions of the silicon nitride film 12 was carried out by XPS, and as a result, the composition at the film surface was detected to be such that silicon: 42% by atom, nitrogen: 32% by atom, oxygen: 19% by atom, and carbon: 7% by atom; thereby the ratio of number of nitrogen atoms/number of silicon atoms being 0.76, while the composition inside the film was detected to be such that silicon: 58% by atom and nitrogen: 42% by atom, thereby the ratio of number of nitrogen atoms/number of silicon atoms being 0.72.

A peak associated with a mode of vibration attributable to the bond of nitrogen and hydrogen near 3370 $cm^{-1}$ was observed in Fourier transform infrared spectroscopy, and thus it was confirmed that hydrogen was contained. Precise quantification was not possible, but it was judged from the peak intensity or the like that the amount of hydrogen was in the range of 1 to 30% by atom.

The member (a-1) was cut into rectangular pieces having a width of 1 cm, a member (b-1) composed of an adhesive containing an epoxy resin and an acid anhydride as the main components was applied on the silicon nitride film 12, and the assembly was adhered on a glass plate and cured at 80° C. for 30 minutes.

Details of the adhesive are as follows:

Bisphenol F diglycidyl ether (product name: EXA-830LVP, manufactured by Dainippon Ink & Chemicals, Inc.): 80 parts by weight 3,4-epoxycyclohexenylmethyl-3',4'-epoxycyclohexene carboxylate (product name: CELLOXIDE 2021P, manufactured by Daicel Chemical Industries, Ltd.): 20 parts by weight Tetrahydromethylphthalic anhydride: 97 parts by weight 2,4,6-Trisdimethylaminomethylphenol (product name: AMICURE 3010, manufactured by Japan Epoxy Resin Co., Ltd.) as a curing accelerator: 2 parts by weight Thereafter, an edge of the member (a-1) was pulled using a tensile/compression tester (Model 210 available from Intesco Co., Ltd.) in a direction perpendicular to the glass plate at a rate of 2 mm/min, to carry out a peeling test. Since the member (a-1) and the glass plate were strongly adhered via the member (b-1), when the tensile load reached 35 N, the member (a-1) fractured, but the adhered part did not peel off.

Subsequently, a peeling test was carried out using the same sample and the same tester under the same conditions, except that the tensile rate was changed to 20 mm/min. Since the member (a-1) and the glass plate were strongly adhered via the member (b-1), when the tensile load reached 30 N, the member (a-1) fractured, but the adhered part did not peel off.

Example 2

The member (a-1) used in Example 1 above was cut into rectangular pieces having a width of 1 cm, a member (b-2) composed of a photocationic polymerization initiator-based adhesive containing an epoxy resin was applied on the silicon nitride film 12, and the assembly was adhered on a glass plate and cured at 3000 mJ/cm² min. The adhesive used herein was obtained as follows.

An ultraviolet-curable resin composition obtained by mixing and dissolving 70 parts by weight of a hydrogenated bisphenol A type epoxy resin (manufactured by Asahi Denka Co., Ltd., ADEKA RESIN EP-4080S), 30 parts by weight of di[1-ethyl-(3-oxetanyl)]methyl ether (manufactured by Toagosei Co, Ltd., ARON OXETANE OXT-221), and 3 parts by weight of (tolylcumyl)iodonium tetrakis(pentafluorophenyl) borate (manufactured by Rhodia, RHODORSIL PHOTOINITIATOR 2074) as a cationic polymerization initiator, was used as the adhesive.

Thereafter, an edge of the member (a-1) was pulled using a tensile/compression tester (Model 210 available from Intesco Co., Ltd.) in a direction perpendicular to the glass plate at a rate of 2 mm/min, to carry out a peeling test. Since the member (a-1) and the glass plate were strongly adhered via the member (b-2), when the tensile load reached 35 N, the member (a-1) fractured, but the adhered part did not peel off.

Subsequently, a peeling test was carried out using the same sample and the same tester under the same conditions, except that the tensile rate was changed to 20 mm/min. Since the member (a-1) and the glass plate were strongly adhered via the member (b-2), when the tensile load reached 30 N, the member (a-1) fractured, but the adhered part did not peel off.

Example 3

The member (a-1) used in Example 1 above was cut into rectangular pieces having a width of 1 cm, a member (b-3) composed of a urethane-based adhesive (manufactured by Sekisui Chemical Co., Ltd.; Esudain UX-10) was applied on the silicon nitride film 12, and the assembly was adhered on a glass plate and cured at 80° C. for 30 minutes.

Thereafter, an edge of the member (a-1) was pulled using a tensile/compression tester (Model 210 available from Intesco Co., Ltd.) in a direction perpendicular to the glass plate at a rate of 20 mm/min, to carry out a peeling test. Since the member (a-1) and the glass plate were strongly adhered via the member (b-3), when the tensile load reached 30 N, the member (a-1) fractured, but the adhered part did not peel off.

Example 4

The member (a-1) used in Example 1 above was cut into rectangular pieces having a width of 1 cm, a member (b-4) composed of a varnish containing a maleic anhydride-styrene copolymer was applied on the silicon nitride film 12, and the assembly was adhered on a glass plate and cured at 80° C. for 30 minutes.

Thereafter, an edge of the member (a-1) was pulled using a tensile/compression tester (Model 210 available from Intesco Co., Ltd.) in a direction perpendicular to the glass plate at a rate of 20 mm/min, to carry out a peeling test. Since the member (a-1) and the glass plate were strongly adhered via the member (b-4), when the tensile load reached 30 N, the member (a-1) fractured, but the adhered part did not peel off.

Comparative Example 1

Adhesion and the peeling test were carried out in the same manner as in Example 1, except that an APEL (registered trademark) film (manufactured by Mitsui Chemical Co., Ltd.) composed of a cycloolefin copolymer and having a thickness of 110 μm was used alone instead of the member (a-1) of Example 1 above. The adherence between the film and the member (b-1) was weak, and thus in both cases of tensile rate of 2 mm/min and of 20 mm/min, the film was easily delaminated from the glass plate (tensile load: less than 0.2 N) because of the interfacial delamination at the interface of film/member (b-1).

Comparative Example 2 to Comparative Example 4

Adhesion and the peeling test were carried out in the same manner as in Example 2 to Example 4, except that an APEL (registered trademark) film (manufactured by Mitsui Chemical Co., Ltd.) composed of a cycloolefin copolymer and having a thickness of 110 μm was used alone instead of the member (a-1) of Example 2 to Example 4 above. The adherence between the film and the members (b-2) to (b-4) was weak, and thus in both cases of tensile rate of 2 mm/min and of 20 mm/min, the film was easily delaminated from the glass plate (tensile load: less than 0.2 N) because of the interfacial delamination at the interface of film/members (b-2) to (b-4).

Example 5

A thin film of silicon nitride was formed on a substrate in a film thickness of 50 nm, in the same manner as in Example 1 above.

FIG. 1 shows the constitution of the present Example, and a silicon nitride film 12 is laminated on a film substrate 11.

In this constitution, the film was colorless and transparent, and the light absorption rate for the visible light region was 1% or less. The steam permeability was 0.02 g/m²/day or less, which value was the detection limit of the apparatus for evaluation, and thus high gas barrier performance could be obtained.

An analysis of the surface and internal compositions of the silicon nitride film was carried out by XPS, and as a result, the composition at the film surface was detected to be such that silicon: 42% by atom, nitrogen: 32% by atom, oxygen: 19% by atom, and carbon: 7% by atom; thereby the ratio of number of nitrogen atoms/number of silicon atoms being 0.76, while the composition inside the film was detected to be such that silicon: 58% by atom and nitrogen: 42% by atom, hereby the ratio of number of nitrogen atoms/number of silicon atoms being 0.72.

A peak associated with a mode of vibration attributable to the bond of nitrogen and hydrogen near 3370 cm$^{-1}$ was observed in Fourier transform infrared spectroscopy, and thus it was confirmed that hydrogen was contained. Precise quantification was not possible, but it was judged from the peak intensity or the like that the amount of hydrogen was in the range of 1 to 30% by atom.

The film was cut into rectangular pieces having a width of 1 cm, an adhesive resin comprising an epoxy resin and an acid anhydride was applied on its silicon nitride film 12, and the assembly was adhered on a glass plate and cured at 80° C. for 30 minutes. Details of the adhesive resin are as follows:

Bisphenol F diglycidyl ether (product name: EXA-830LVP, manufactured by Dainippon Ink & Chemicals, Inc.): 80 parts by weight 3,4-epoxycyclohexenylmethyl-3',4'-epoxycyclohexene carboxylate (product name: CELLOXIDE 2021P, manufactured by Daicel Chemical Industries, Ltd.): 20 parts by weight Tetrahydromethylphthalic anhydride: 97 parts by weight 2,4,6-Trisdimethylaminomethylphenol (product name: AMICURE 3010, manufactured by Japan Epoxy Resin Co., Ltd.) as a curing accelerator: 2 parts by weight Thereafter, an edge of the film was pulled using a tensile/compression tester (Model 210 available from Intesco Co., Ltd.) in a direction perpendicular to the glass plate at a rate of 2 mm/min, to carry out a peeling test. The film and the glass plate were strongly adhered, and the film fractured under a tensile load of 35 N, but the adhered part did not peel off.

Subsequently, a peeling test was carried out using the same sample and the same tester under the same conditions, except that the tensile rate was changed to 20 mm/min. The film and the glass plate were strongly adhered, and the film fractured under a tensile load of 30 N, but the adhered part did not peel off.

Reference Example 1

An APEL (registered trademark) film (manufactured by Mitsui Chemicals Co., Ltd.) composed of a cycloolefin copolymer and having a thickness of 110 μm was used as a substrate, and a thin film of silicon oxynitride was formed on the film by sputtering on the film at a high frequency wave of 13.56 MHz using a silicon target.

More specifically, the film was placed on the support of the substrate in a vacuum vessel at room temperature, and after vacuumizing the vessel until the degree of vacuum reached 1.3×10$^{-3}$ Pa, subsequently oxygen gas was introduced into the vacuum vessel in which the film was placed. After introducing a bias on the side where the film was placed, high frequency plasma of 100 W was applied over the film to carry out surface treatment of the film for 30 seconds. Subsequently, argon gas, oxygen gas and nitrogen gas were introduced into the vacuum vessel in which the film was placed, and after introducing a bias on the silicon target side, high frequency plasma of 300 W was applied to form a thin film of silicon oxynitride in a thickness of 30 nm.

In this constitution, the film was colorless and transparent, and the light absorption rate with respect to the visible light region was 2% or less. The steam permeability was 0.02 g/m$^2$/day or less, which value was the detection limit of the apparatus for evaluation, and thus high gas barrier performance could be obtained.

An analysis of the surface and internal compositions of the silicon oxynitride film was carried out by XPS, and as a result, the composition at the film surface was detected to be such that silicon: 37% by atom, nitrogen: 31% by atom, oxygen: 16% by atom, and carbon: 16% by atom; thereby the ratio of number of nitrogen atoms/number of silicon atoms being 0.84, while the composition inside the film was detected to be such that silicon: 51% by atom, nitrogen: 24% by atom, and oxygen: 25% by atom, thereby the ratio of number of nitrogen atoms/number of silicon atoms being 0.47.

A peak associated with a mode of vibration attributable to the bond of nitrogen and hydrogen near 3370 cm$^{-1}$ was not observed in Fourier transform infrared spectroscopy.

The film was cut into rectangular pieces having a width of 1 cm. An adhesive resin comprising an epoxy resin and an acid anhydride, which was the same as the adhesive resin used in Example 5, was applied on the silicon oxynitride film, and the assembly was adhered on a glass plate and cured at 80° C. for 30 minutes.

Thereafter, an edge of the film was pulled using a tensile/compression tester (Model 210 available from Intesco Co., Ltd.) in a direction perpendicular to the glass plate at a rate of 2 mm/min, to carry out a peeling test. When the tensile load was 12 N, the adhered part peeled off.

Subsequently, a peeling test was carried out using the same sample and the same tester under the same conditions, except that the tensile rate was changed to 20 mm/min. The film and the glass plate were strongly adhered, and the film fractured under a tensile load of 30 N, but the adhered part did not peel off.

Comparative Example 5

An evaluation was carried out with a single piece of an APEL (registered trademark) film (manufactured by Mitsui Chemicals Co., Ltd.) composed of a cycloolefin copolymer and having a thickness of 110 μm. In this constitution, the film was colorless and transparent, and the light absorption rate with respect to the visible light region was 1% or less.

The steam permeability was 0.53 g/m$^2$/day.

The film was cut into rectangular pieces having a width of 1 cm. An adhesive resin comprising an epoxy resin and an acid anhydride, which was the same as the adhesive resin used in Example 5 above, was applied on the film, and the assembly was adhered on a glass plate and cured at 80° C. for 30 minutes.

Thereafter, an edge of the film was pulled using a tensile/compression tester (Model 210 available from Intesco Co., Ltd.) in a direction perpendicular to the glass plate at a rate of 20 mm/min, to carry out a peeling test. The adherence between the film and the adhesive resin was weak, and thus the film was easily delaminated from the glass plate (tensile load: less than 0.2 N), because of the interfacial delamination at the interface of film/adhesive resin.

Comparative Example 6

An APEL (registered trademark) film (manufactured by Mitsui Chemicals Co., Ltd.) composed of a cycloolefin copolymer and having a thickness of 110 μm was used as a substrate, and a thin film of silicon oxide was formed on the film by sputtering on the film at a high frequency wave of 13.56 MHz using a silicon target.

More specifically, the film was placed on the support of the substrate in a vacuum vessel at room temperature, and after vacuumizing the vessel until the degree of vacuum reached 1.3×10$^{-3}$ Pa, subsequently oxygen gas was introduced into the vacuum vessel in which the film was placed. After introducing a bias on the side where the film was placed, high frequency plasma of 100 W was applied over the film to carry out surface treatment of the film for 30 seconds. Subsequently, argon gas and oxygen gas were introduced into the vacuum vessel in which the film was placed, and after introducing a bias on the silicon target side, high frequency plasma of 300 W was applied to form a thin film of silicon oxide in a thickness of 30 nm.

In this constitution, the film was colorless and transparent, and the light absorption rate with respect to the visible light region was 1% or less.

The steam permeability was 0.05 g/m$^2$/day.

An analysis of the surface and internal compositions of the silicon oxide film was carried out by XPS, and as a result, the composition at the film surface was detected to be such that silicon: 32% by atom, oxygen: 54% by atom, and carbon: 14% by atom, while the composition inside the film was detected to be such that silicon: 38% by atom, and oxygen: 62% by atom.

The film was cut into rectangular pieces having a width of 1 cm. An adhesive resin comprising an epoxy resin and an acid anhydride, which was the same as the adhesive resin used in Example 5 above, was applied on its silicon oxide thin film side, and the assembly was adhered on a glass plate and cured at 80° C. for 30 minutes.

Thereafter, an edge of the film was pulled using a tensile/compression tester (Model 210 available from Intesco Co., Ltd.) in a direction perpendicular to the glass plate at a rate of 20 mm/min, to carry out a peeling test. The adherence between the film and the adhesive resin was weak, and thus the film was easily delaminated from the glass plate (tensile load: less than 0.2 N), because of the interfacial delamination at the interface of film/adhesive resin.

Example 6

A thin film of silicon nitride was formed on a substrate in the same manner as in Example 1 above, except that the thin film of silicon nitride was formed in a thickness of 20 nm.

An indium oxide-tin oxide (hereinafter, referred to as ITO) layer was provided on the resulting silicon nitride thin film as a transparent conductive layer, by DC magnetron sputtering. More specifically, after vacuumizing a vacuum vessel to 1.3× 10$^{-3}$ Pa or lower, argon gas was introduced to a pressure of 0.27 Pa, and an ITO thin film having a thickness of 20 nm was produced by DC magnetron sputtering, using an indium-tin alloy target (In:Sn=9:1).

In this constitution, the light transmissivity at a wavelength of 550 nm was 85%, and the sheet resistance value was 800 Ω/SQ.

In the step of forming a silicon nitride film prior to the formation of ITO, the film was colorless and transparent, and the light absorption rate with respect to the visible light region was 1% or less.

An analysis of the surface and internal compositions of the silicon nitride film was carried out by XPS, and as a result, the composition at the film surface was detected to be such that silicon: 42% by atom, nitrogen: 32% by atom, oxygen: 19% by atom, and carbon: 7% by atom, thereby the ratio of number of nitrogen atoms/number of silicon atoms being 0.76, while the composition inside the film was detected to be such that silicon: 58% by atom, and nitrogen: 42% by atom, thereby the ratio of number of nitrogen atoms/number of silicon atoms being 0.72.

A peak associated with a mode of vibration attributable to the bond of nitrogen and hydrogen near 3370 cm$^{-1}$ was observed in Fourier transform infrared spectroscopy, that is, it was confirmed that hydrogen was contained. Precise quantification was not possible, but it was judged from the peak intensity or the like that the amount of hydrogen was in the range of 1 to 30% by atom.

Figure 2:
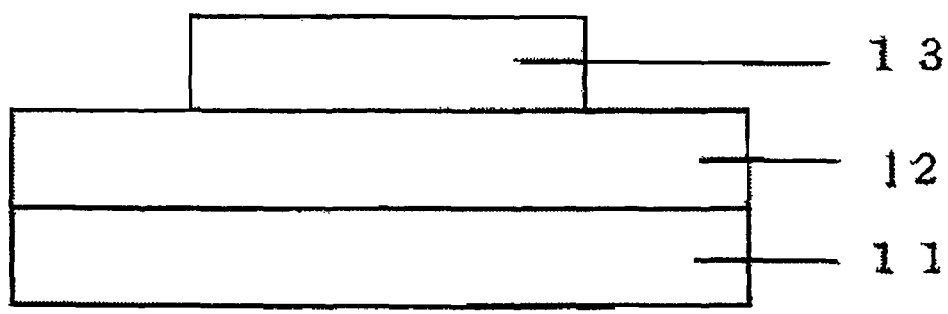
FIG. 2 is a cross-sectional view briefly illustrating the structure of a preferred exemplary embodiment of the composite film of the present invention (transparent conductive film).

The film having the silicon nitride film and the ITO film was cut into rectangular pieces having a width of 2 cm. After patterning with resist, and etching the ITO film with dilute hydrochloric acid at both edges along the longitudinal direction of the rectangle to a width of 5 mm, an adhesive resin comprising an epoxy resin and an acid anhydride was applied on the silicon nitride film that was exposed on both edges of the surface after etching. The assembly was adhered to a glass plate and cured at 80° C. for 30 minutes. FIG. 2 is the constitution of the present Example, and the silicon nitride film 12 and the patterned ITO film 13 are laminated on the film substrate 11. Details of the adhesive resin are as follows:

Bisphenol F diglycidyl ether (product name: EXA-830LVP, manufactured by Dainippon Ink & Chemicals, Inc.): 80 parts by weight 3,4-epoxycyclohexenylmethyl-3',4'-epoxycyclohexene carboxylate (product name: CELLOXIDE 2021P, manufactured by Daicel Chemical Industries, Ltd.): 20 parts by weight Tetrahydromethylphthalic anhydride: 97 parts by weight 2,4,6-Trisdimethylaminomethylphenol (product name: AMICURE 3010, manufactured by Japan Epoxy Resin Co., Ltd.) as a curing accelerator: 2 parts by weight Thereafter, an edge of the film was pulled using a tensile/compression tester (Model 210 available from Intesco Co., Ltd.) in a direction perpendicular to the glass plate at a rate of 2 mm/min, to carry out a peeling test. The film and the glass plate were strongly adhered, and the film fractured under a tensile load of 35 N, but the adhered part did not peel off.

Subsequently, a peeling test was carried out using the same sample and the same tester under the same conditions, except that the tensile rate was changed to 20 mm/min. The film and the glass plate were strongly adhered, and the film fractured under a tensile load of 30 N, but the adhered part did not peel off.

Reference Example 2

A thin film of silicon oxynitride was formed on a substrate in the same manner as in Reference Example 1 above, except that the thin film of silicon oxynitride was formed in a thickness of 20 nm.

An indium oxide-tin oxide (hereinafter, referred to as ITO) layer was provided on the resulting silicon oxynitride thin film as a transparent conductive layer, by DC magnetron sputtering in the same manner as in Example 6 above.

In this constitution, the light transmissivity at a wavelength of 550 nm was 86%, and the sheet resistance value was 800 Ω/SQ.

In the step of forming a silicon oxynitride film prior to the formation of ITO, the film was colorless and transparent, and the light absorption rate with respect to the visible light region was 1% or less.

An analysis of the surface and internal compositions of the silicon oxynitride film was carried out by XPS, and as a result, the composition at the film surface was detected to be such that silicon: 37% by atom, nitrogen: 31% by atom, oxygen: 16% by atom, and carbon: 16% by atom, thereby the ratio of number of nitrogen atoms/number of silicon atoms being 0.84, while the composition inside the film was detected to be such that silicon: 51% by atom, nitrogen: 24% by atom, and oxygen: 25% by atom, thereby the ratio of number of nitrogen atoms/number of silicon atoms being 0.47.

A peak associated with a mode of vibration attributable to the bond of nitrogen and hydrogen near 3370 cm$^{-1}$ was not observed in Fourier transform infrared spectroscopy.

The film having the silicon oxynitride film and the ITO film was cut into rectangular pieces having a width of 2 cm. After patterning with resist, and etching the ITO film with dilute hydrochloric acid at both edges along the longitudinal direction of the rectangle to a width of 5 mm, an adhesive resin comprising an epoxy resin and an acid anhydride, which was the same as the adhesive resin used in Example 6 above, was applied on the silicon oxynitride film that was exposed on both edges of the surface after etching. The assembly was adhered to a glass plate and cured at 80° C. for 30 minutes.

Thereafter, an edge of the film was pulled using a tensile/compression tester (Model 210 available from Intesco Co., Ltd.) in a direction perpendicular to the glass plate at a rate of 2 mm/min, to carry out a peeling test. When the tensile load was 12 N, the adhered part peeled off.

Subsequently, a peeling test was carried out using the same sample and the same tester under the same conditions, except that the tensile rate was changed to 20 mm/min. The film and the glass plate were strongly adhered, and the film fractured under a tensile load of 30 N, but the adhered part did not peel off.

Comparative Example 7

An APEL (registered trademark) film (manufactured by Mitsui Chemicals Co., Ltd.) composed of a cycloolefin copolymer and having a thickness of 110 μm was used as a substrate. The film was placed on the support of a substrate at room temperature in a vacuum vessel. After vacuumizing the vessel until the degree of vacuum reached $1.3 \times 10^{-4}$ Pa, oxygen gas was introduced into the vacuum vessel in which the film was placed, and after introducing a bias on the side where the film was placed, high frequency plasma of 100 W was applied over the film to carry out surface treatment of the film for 30 seconds. Subsequently, argon gas was introduced into the vacuum vessel in which the film was placed to a pressure of 0.27 Pa, and an ITO thin film having a thickness of 20 nm was produced by DC magnetron sputtering, using an indium-tin alloy target (In:Sn=9:1).

In this constitution the light transmissivity at a wavelength of 550 nm was 89%, and the sheet resistance value was 800 Ω/SQ.

The film having the ITO film was cut into rectangular pieces having a width of 2 cm. After patterning with resist, and etching the ITO film with dilute hydrochloric acid at both edges along the longitudinal direction of the rectangle to a width of 5 mm, an adhesive resin comprising an epoxy resin and an acid anhydride, which was the same as the adhesive resin used in Example 6 above, was applied on both etched edges. The assembly was adhered to a glass plate and cured at 80° C. for 30 minutes.

Thereafter, an edge of the film was pulled using a tensile/compression tester (Model 210 available from Intesco Co., Ltd.) in a direction perpendicular to the glass plate at a rate of 20 mm/min, to carry out a peeling test. The adherence between the film and the adhesive resin was weak, and thus the film was easily delaminated from the glass plate (tensile load: less than 0.2 N), because of the interfacial delamination at the interface of the film adhesive-resin.

INDUSTRIAL APPLICABILITY

The bonding method (adhesion, coating, painting, etc.) and bonded products such as composite film (sealant film, transparent conductive film, adhesion product, coated product, painted product, etc.) of the present invention are very useful for optical parts and electronic or electric parts, for example, in the fields of display elements, such as flat panel displays, organic EL elements and electronic paper.

The invention claimed is:

1. A bonding method of bonding a member (a) having a layer (a1) comprising an organic polymer (A), and a member (b) containing a compound (B) having at least one functional group selected from the group consisting of an isocyanate group, a carboxyl group and a cyclic ether group, wherein the bonding method comprises bonding the member (a) and the member (b) via a layer comprising an inorganic compound (C) which has nitrogen atoms, hydrogen atoms and silicon atoms and in which the ratio of the number of the nitrogen atoms/the number of the silicon atoms is in the range of from 0.01 to 2, the layer being provided on at least a part of the outermost surface of the member (a), and wherein the organic polymer (A) is at least one resin selected from the group consisting of cycloolefin (co) polymers, 4-methyl-1-pentene copolymers, polyacetal (POM), polybutylene terephthalate (PBT), polyethylene terephthalate (PET), polyphenylene sulfide (PPS), polyether ether ketone (PEEK), liquid crystalline polymers (LCP), fluorinated resins, polyethernitrile (PEN), modified polyphenylene ether (mPPE), polyamideimide (PAI) and polyetherimide (PEI), and after the implementation of the bonding method, there exists at least one region having the layer (a1) comprising the organic polymer (A) of the member (a), the layer comprising the inorganic compound (C) on said at least a part of the outermost surface of the member (a), and the member (b) disposed in this order and directly bonded.

2. The bonding method according to claim 1, wherein at least a part of the layer (a1) comprising the organic polymer (A) in the member (a) is in direct contact with the layer comprising the inorganic compound (C).

3. The bonding method according to claim 1, wherein after the implementation of the bonding method, at least a part of the member (b) is directly bonded to the layer comprising the inorganic compound (C) on said at least a part of the outermost surface of the member (a).

4. The bonding method according to claim 1, wherein the amount of hydrogen in the inorganic compound (C) is 1 to 40% by atom.

5. The bonding method according to any one of claims 1 to 3 and 4, wherein the compound (B) having at least one functional group is selected from the group consisting of an isocyanate group, a carboxyl group and a cyclic ether group, is a compound having at least an epoxy group.

6. A sealing method using the bonding method according to any one of claims 1 to 3 and 4.

7. A composite film produced by using the bonding method according to any one of claims 1 to 3 and 4.

8. A method for producing an optical part or an electronic or electric part, comprising the step of using the bonding method according to any one of claims 1 to 3 and 4.

9. An optical part produced by using the bonding method according to claim 1.

10. An electronic or electric part produced by using the bonding method according to claim 1.

11. An electronic or electric instrument or a transport machine having the optical part according to claim 9 or the electronic or electric part according to claim 10.

12. A composite film comprising a laminate having a layer (a1) comprising an organic polymer (A), a layer (c1) comprising an inorganic compound (C) which has nitrogen atoms, hydrogen atoms and silicon atoms, and a layer (b1) comprising an adhesive resin (B1) disposed in this order, wherein the organic polymer (A) is at least one resin selected from the group consisting of cycloolefin (co) polymers, 4-methyl-1-pentene copolymers, polyacetal (POM), polybutylene terephthalate (PBT), polyethylene terephthalate (PET), polyphenylene sulfide (PPS), polyether ether ketone (PEEK), liquid crystalline polymers (LCP), fluorinated resins, polyethernitrile (PEN), modified polyphenylene ether (mPPE), polyamideimide (PAI) and polyetherimide (PEI), and wherein the layer (a1) comprising an organic polymer (A), the layer (c1) comprising the compound (C) which has nitrogen atoms, hydrogen atoms and silicon atoms, and the layer (b1) comprising the adhesive resin (B1) are directly laminated.

13. An optical part comprising the composite film according to claim 12.

14. An electronic or electric part comprising the composite film according to claim 12.

15. An electronic or electric instrument or a transport machine having the electronic or electric part according to claim 14.

16. The composite film according to claim 12, wherein the amount of hydrogen in the inorganic compound (C) is 1 to 40% by atom.

* * * * *